(12) United States Patent
Lin

(10) Patent No.: US 9,396,804 B1
(45) Date of Patent: Jul. 19, 2016

(54) MEMORY PROGRAMMING METHOD, MEMORY CONTROL CIRCUIT UNIT AND MEMORY STORAGE APPARATUS

(71) Applicant: PHISON ELECTRONICS CORP., Miaoli (TW)

(72) Inventor: Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/854,056

(22) Filed: Sep. 15, 2015

(30) Foreign Application Priority Data

Aug. 6, 2015 (TW) .............................. 104125604 A

(51) Int. Cl.
*G11C 16/00* (2006.01)
*G11C 16/14* (2006.01)
*G11C 16/10* (2006.01)

(52) U.S. Cl.
CPC ................ *G11C 16/14* (2013.01); *G11C 16/10* (2013.01); *G11C 16/107* (2013.01)

(58) Field of Classification Search
CPC ................................. G11C 16/14; G11C 16/10

USPC ............. 365/185.29, 185.11, 185.12, 185.17, 365/185.28
See application file for complete search history.

(56) References Cited

U.S. PATENT DOCUMENTS

| 8,427,868 | B2* | 4/2013 | Chevallier | G11C 5/02 365/185.03 |
| 8,508,999 | B2* | 8/2013 | Liu | H01L 27/11521 365/185.17 |
| 2010/0034028 | A1* | 2/2010 | Katsumata | G11C 11/5671 365/185.28 |

* cited by examiner

*Primary Examiner* — Tan T Nguyen
(74) *Attorney, Agent, or Firm* — Jianq Chyun IP Office

(57) ABSTRACT

A memory programming method for a physical erasing unit of a rewritable non-volatile memory is provided. The method includes: programming a first data stream into a first physical programming unit, wherein the first physical programming unit is constituted by memory cells at intersection of a first bit line set of the physical erasing unit and a first word line layer of the physical erasing unit. The method further includes: after programming the first data stream into the first physical programming unit, programming another data stream into another physical programming unit, and the another physical programming unit is constituted by the memory cells at intersection of the first bit line set of the physical erasing unit and another word line layer of the physical erasing unit.

27 Claims, 44 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

MEMORY PROGRAMMING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 104125604, filed on Aug. 6, 2015. The entirety of the above-mentioned patent application is hereby incorporated by reference herein and made a part of this specification.

BACKGROUND

1. Technical Field

The present invention relates to a memory programming method, and more particularly, relates to a memory programming method for a rewritable non-volatile memory module and a memory control circuit unit and a memory storage apparatus using the method.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

In general, a control circuit stores data by applying voltage to word lines (or word line layers) and programming selected memory cells in the rewritable non-volatile memory module through bit lines. However, during the process of programming, it is possible that a programming failure may occur due to open or short of the word lines (or the word line layers). In particular, if the rewritable non-volatile memory module supports functions of a full-page programming, a buffer memory is required by the control circuit is order to store programmed data for a re-writing process in response to the programming failure. However, for the rewritable non-volatile memories such as a solid state drive or a flash memory drive, because said memories are small in size, a random access memory with large volume cannot be disposed therein to temporarily store the programmed data. Accordingly, it is one of the major subjects in the industry as how to prevent a data loss if open and short occurs on the word lines (or the word line layers) while programming the memory cells.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a memory programming method, a memory control circuit unit and a memory storage apparatus, which are capable of preventing the data loss if the programming failure occurs.

An exemplary embodiment of the present invention provides a memory programming method for a physical erasing unit of a rewritable non-volatile memory module. The physical erasing unit includes a plurality of word line layers and a plurality of bit line sets, the bit line sets are arranged along a first direction and separated from one another, each of the bit line sets comprises a plurality of bit lines, the bit lines of each bit line sets are extended along a second direction, arranged along a third direction and separated from one another, the word line layers are stacked along the second direction and the word line layers are separated from one another, a memory cell is provided at intersection of each of the word line layers and each of the bit lines of each of the bit line sets, at least one physical programming unit is constituted by the memory cells at intersection of one of the bit line sets and one of the word line layers. The memory programming method includes: programming a first data stream into at least one first physical programming unit of the physical erasing unit, wherein the first physical programming unit is constituted by the memory cells at intersection of at least one first bit line set among the bit line sets and a first word line layer among the word line layers. In addition, the memory programming method further includes: after programming the first data stream into the first physical programming unit, programming another data stream into at least one another physical programming unit of the physical erasing unit, wherein the another physical programming unit is constituted by the memory cells at intersection of the first bit line set and another word line layer among the word line layers.

An exemplary embodiment of the present invention provides a memory control circuit unit configured to access a rewritable non-volatile memory module. The memory control circuit unit includes a host interface, a memory interface and a memory management circuit. The host interface is configured to couple to a host system. The memory interface is used for coupling to the rewritable non-volatile memory module. The rewritable non-volatile memory module includes a physical erasing unit. The physical erasing unit includes a plurality of word line layers and a plurality of bit line sets, the bit line sets are arranged along a first direction and separated from one another, each of the bit line sets comprises a plurality of bit lines, the bit lines of each bit line sets are extended along a second direction, arranged along a third direction and separated from one another, the word line layers are stacked along the second direction and the word line layers are separated from one another, a memory cell is provided at intersection of each of the word line layers and each of the bit lines of each of the bit line sets, at least one physical programming unit is constituted by the memory cells at intersection of one of the bit line sets and one of the word line layers. The memory management circuit is configured to issue a first command sequence, so as to program a first data stream into at least one first physical programming unit of the physical erasing unit, wherein the first physical programming unit is constituted by the memory cells at intersection of at least one first bit line set among the bit line sets and a first word line layer among the word line layers. Further, after programming the first data stream into the first physical programming unit, the memory management circuit is further configured to issue a second command sequence, so as to program another data stream into at least one another physical programming unit of the physical erasing unit, wherein the another physical programming unit is constituted by the memory cells at intersection of the first bit line set and another word line layer among the word line layers.

An exemplary embodiment of the present invention provides a memory storage apparatus which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The rewritable non-volatile memory module includes a physical erasing unit. The physical erasing unit includes a plurality of word line layers and a plurality of bit line sets, the bit line sets are arranged along a first direction and separated from one another, each of the bit line sets comprises a plurality of bit lines, the bit lines of each bit line sets are extended along a second direction, arranged along a third direction and separated from one another, the word line layers are stacked along the second direction and the word line layers are separated from one another, a memory cell is provided at intersection of each of the word line layers and each of the bit lines of each of the bit line sets, at least one physical programming unit is constituted by the memory cells at intersection of one of the bit line sets and one of the word line layers. The memory control circuit unit is configured to issue a first command sequence, so as to program a first data stream into at least one first physical programming unit of the physical erasing unit, wherein the first physical programming unit is constituted by the memory cells at intersection of at least one first bit line set among the bit line sets and a first word line layer among the word line layers. Further, after programming the first data stream into the first physical programming unit, the memory control circuit unit is further configured to issue a second command sequence, so as to program another data stream into at least one another physical programming unit of the physical erasing unit, wherein the another physical programming unit is constituted by the memory cells at intersection of the first bit line set and another word line layer among the word line layers.

Based on the above, the memory programming method, the memory control circuit unit and the memory storage apparatus provided according to the exemplary embodiments are capable of preventing the data loss if open and short occurs on the word lines (or the word line layers).

To make the above features and advantages of the present disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9, FIG. 10, FIG. 11 and FIG. 12 are schematic diagrams illustrating a management of the physical erasing unit according to an exemplary embodiment.

DESCRIPTION OF THE EMBODIMENTS

Figure 1:
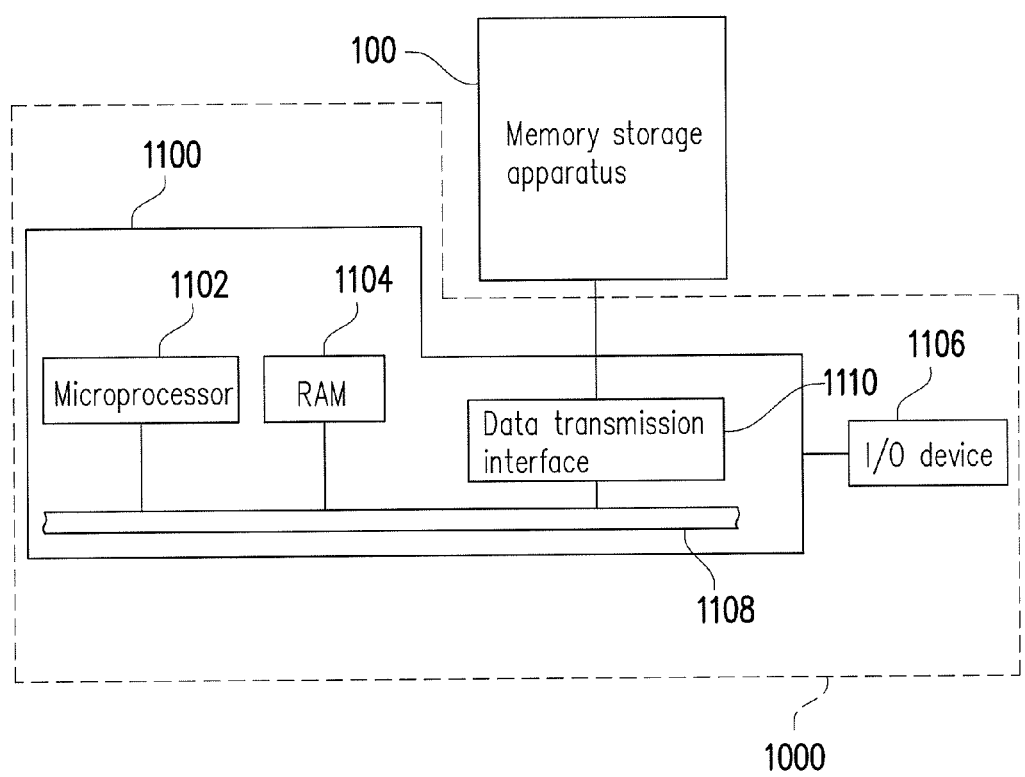
FIG. 1 illustrates a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit). The memory storage apparatus is usually configured together with a host system so that the host system may write data into the memory storage apparatus or read data from the memory storage apparatus.

First Exemplary Embodiment

Figure 2:
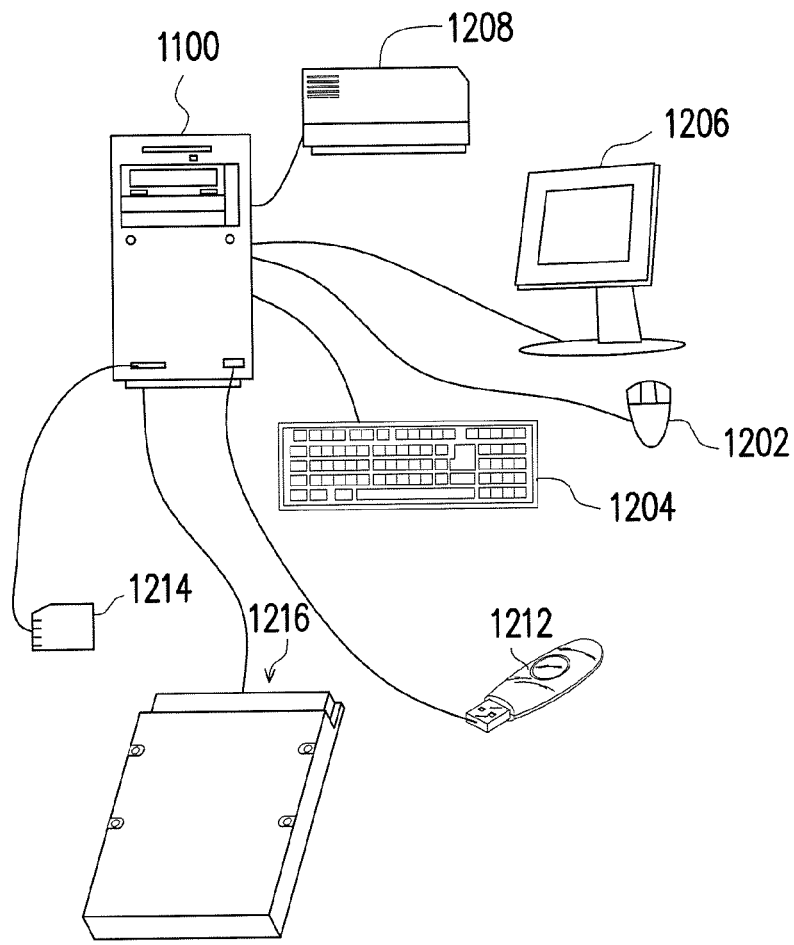
FIG. 2 is a schematic diagram illustrating a computer, an input/output device and a memory storage apparatus according to an exemplary embodiment.

FIG. 1 illustrates a host system and a memory storage apparatus according to an exemplary embodiment. Referring to FIG. 1, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In the present embodiment of the invention, the memory storage apparatus 100 is coupled to other devices of the host system 1000 through the data transmission interface 1110. By using the microprocessor 1102, the random access memory (RAM) 1104 and the Input/Output (I/O) device 1106, data may be written into the memory storage apparatus 100 or may be read from the memory storage apparatus 100. For example, the memory storage apparatus 100 may be a rewritable non-volatile memory storage apparatus such as a flash drive 1212, a memory card 1214, or a solid state drive (SSD) 1216 as shown in FIG. 2.

Figure 3:
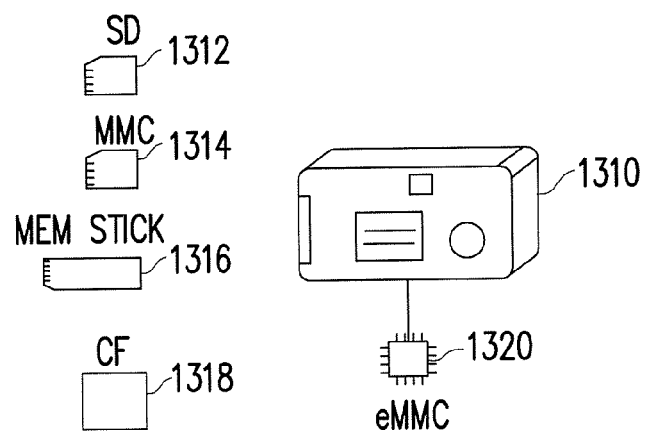
FIG. 3 is a schematic diagram illustrating a host system and a memory storage apparatus according to an exemplary embodiment.

Generally, the host system 1000 may substantially be any system capable of cooperating with the memory storage apparatus 100 for storing data. Even though the host system 1000 is illustrated as a computer system in the present exemplary embodiment, in another exemplary embodiment of the present invention, the host system 1000 may be a digital camera, a video camera, a telecommunication device, an audio player, or a video player. For example, if the host system is a digital camera (video camera) 1310, the rewritable non-volatile memory storage apparatus may be a SD card 1312, a MMC card 1314, a memory stick 1316, a CF card 1318 or an embedded storage device 1320 (as shown by FIG. 3). The embedded storage device 1320 includes an embedded MMC (eMMC). It should be mentioned that the eMMC is directly coupled to a substrate of the host system.

Figure 4:
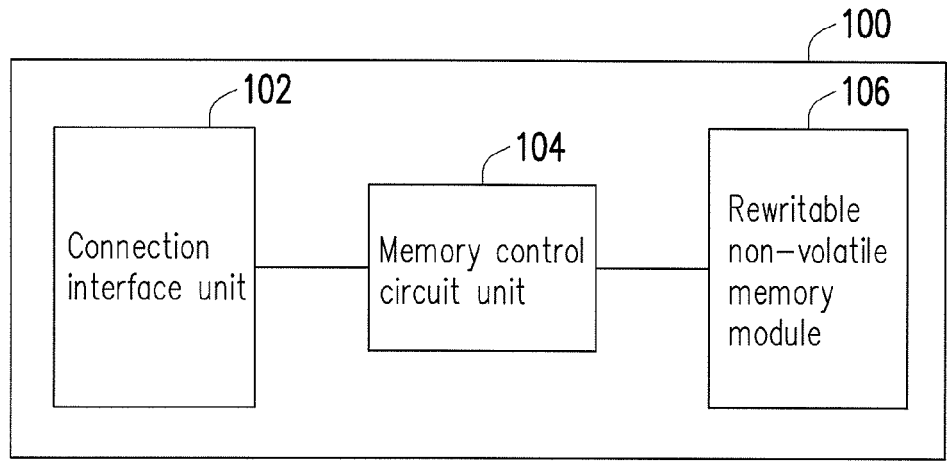
FIG. 4 is a schematic block diagram illustrating a memory storage apparatus according to an exemplary embodiment.

FIG. 4 is a schematic block diagram illustrating a memory storage apparatus according to an exemplary embodiment. Referring to FIG. 4, the memory storage apparatus 100 includes a connection interface unit 102, a memory control circuit unit 104 and a rewritable non-volatile memory module 106.

In the present exemplary embodiment, the connection interface unit 102 is compatible with a universal serial bus (USB) interface. Nevertheless, it should be understood that the invention is not limited thereto. The connection interface unit 102 may also be compatible to a Parallel Advanced Technology Attachment (PATA) standard, an Institute of Electrical and Electronic Engineers (IEEE) 1394 standard, a peripheral component interconnect (PCI) Express interface standard, a Secure Digital (SD) interface standard, a Serial Advanced Technology Attachment (SATA) standard, a Ultra High Speed-I (UHS-I) interface standard, a Ultra High Speed-II (UHS-II) interface standard, a memory stick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards.

The memory control circuit unit 104 is configured to execute a plurality of logic gates or control commands which are implemented in a hardware form or in a firmware foil', so as to execute operations of writing, reading or erasing data in the rewritable non-volatile memory storage module 106 according to the commands of the host system 1000.

The rewritable non-volatile memory module 106 is coupled to the memory control circuit unit 104 and configured to store data written from the host system 1000. Specifically, multiple physical programming units are constituted by memory cells of the rewritable non-volatile memory module 106 in order to store data. In the present exemplary embodiment, the rewritable non-volatile memory module 106 is a Trinary Level Cell (TLC) NAND flash memory module (i.e., a flash memory module capable of storing three bit data in one memory cell). However, the invention is not limited thereto. The rewritable non-volatile memory module 106 may also be a Multi Level Cell (MLC) NAND-type flash memory module (i.e., a flash memory module capable of storing two bit data in one memory cell), other flash memory modules or other memory module having the same features.

Figure 5:
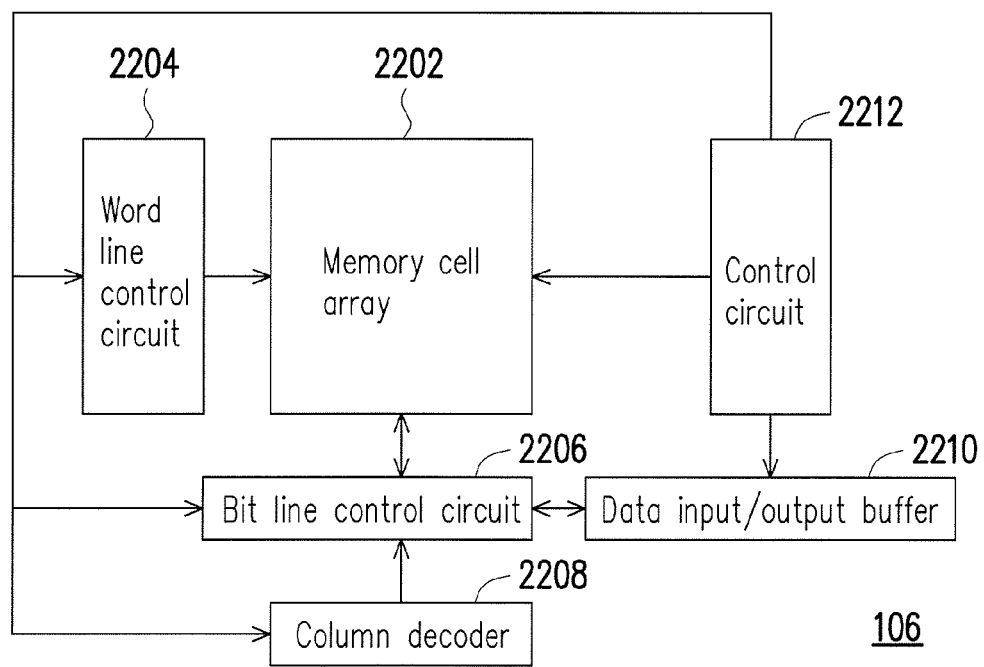
FIG. 5 is a schematic block diagram illustrating a rewritable non-volatile memory module according to an exemplary embodiment.

FIG. 5 is a schematic block diagram illustrating a rewritable non-volatile memory module according to an exemplary embodiment. Referring to FIG. 5, the rewritable non-volatile memory module 106 includes a memory cell array 2202, a word line control circuit 2204, a bit line control circuit 2206, a column decoder 2208, a data input-output buffer 2210 and a control circuit 2212.

Figure 6:
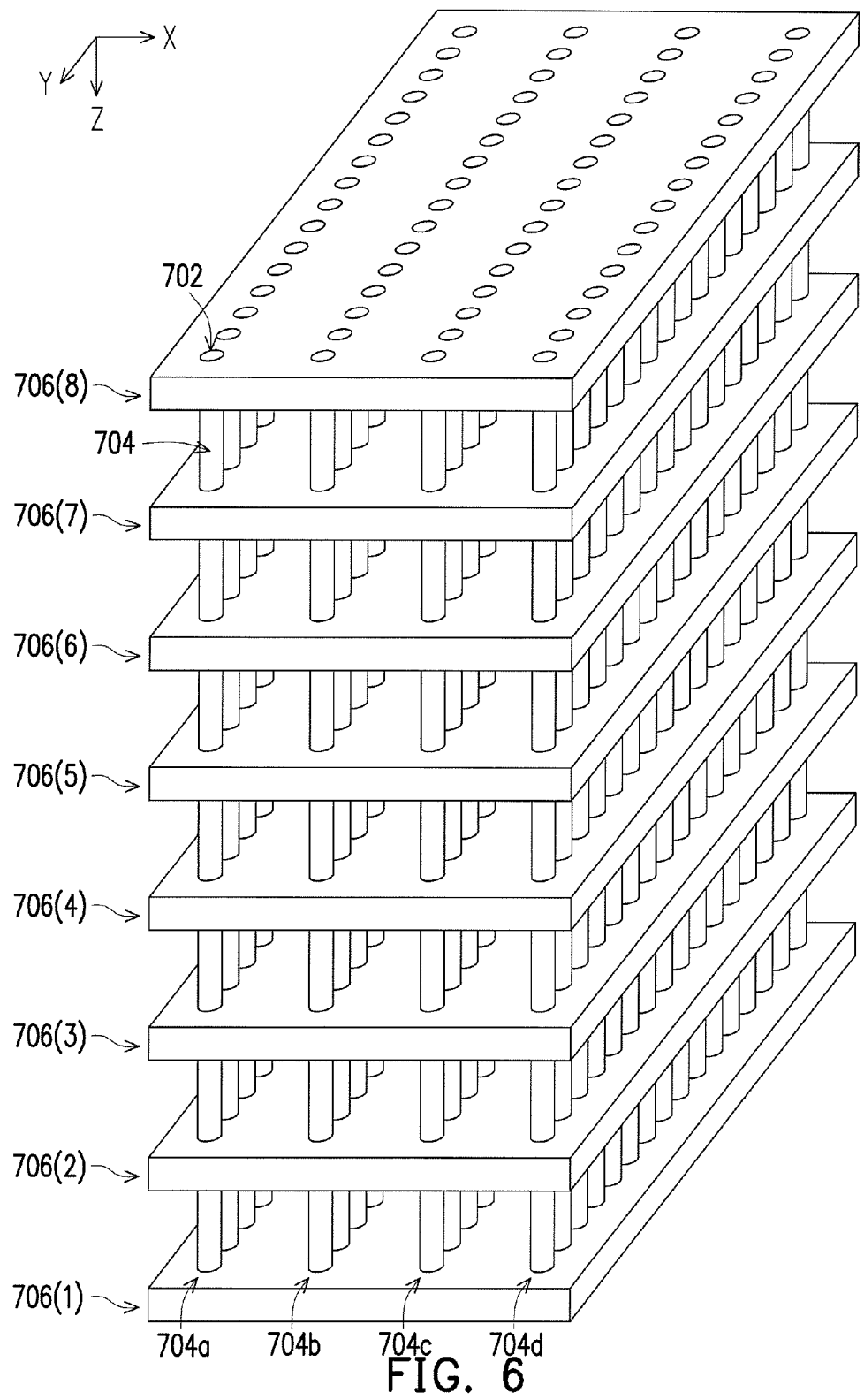
FIG. 6 is a schematic diagram illustrating a memory cell array of the physical erasing unit according to an exemplary embodiment.

FIG. 6 is a schematic diagram illustrating a memory cell array of the physical erasing unit according to an exemplary embodiment.

Referring to FIG. 5 and FIG. 6, a memory cell array 2202 includes a plurality of memory cells 702 for storing data, a plurality of bit line sets each including a plurality of bit lines 704 and a plurality of word line layers (e.g., a first word line layer 706(1), a second word line layer 706(2), a third word line layer 706(3), a fourth word line layer 706(4), a fifth word line layer 706(5), a sixth word line layer 706(6), a seventh word line layer 706(7) and an eighth word line layer 706(8)). The physical erasing unit is constituted by the memory cells 702 in the memory cell array 2202. Specifically, bit line sets 704a, 704b, 704c and 704d are arranged along a first direction and separated from one another. Each of the bit line sets includes a plurality of bit lines which are arranged along a third direction, separated from one another, and extended along a second direction. The word line layers 706 are stacked along the second direction and the word line layers 706 are separated from one another. For example, the first direction is X-axis, the second direction is Z-axis and the third direction is Y-axis. The memory cells for constituting the physical erasing unit are located at intersection of each of the word line layers and each of the bit lines of each of the bit line sets. In the present exemplary embodiment, the rewritable non-volatile memory module 106 is a TLC NAND flash memory module, such that three physical programming units are constituted by the memory cells at intersection of each of the bit line sets and each of the word line layers. In an example where the rewritable non-volatile memory module 106 is a TLC NAND flash memory module, two physical programming units are constituted by the memory cells at intersection of each of the bit line sets and each of the word line layers. If a write command or a read command is received from the memory control circuit unit 104, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 706, the bit line control circuit 2206 is configured to control voltages applied to the bit lines 704, the column decoder 2208 is configured to select the corresponding bit line according to a decoding row address in a command, and the data input/output buffer 2210 is configured to temporarily store the data. The memory cells in the rewritable non-volatile memory module 106 uses represent bits data by using a plurality of gate voltages. A data writing (or known as programming) operation of the memory cells of the memory cell array 2202 changes an on-state of a channel of the memory cell in order to present different storage states by applying a voltage to a specific terminal (e.g., amount of electrons in an charge-trapping layer of a gate may be changed by controlling a gate voltage).

Figure 7:
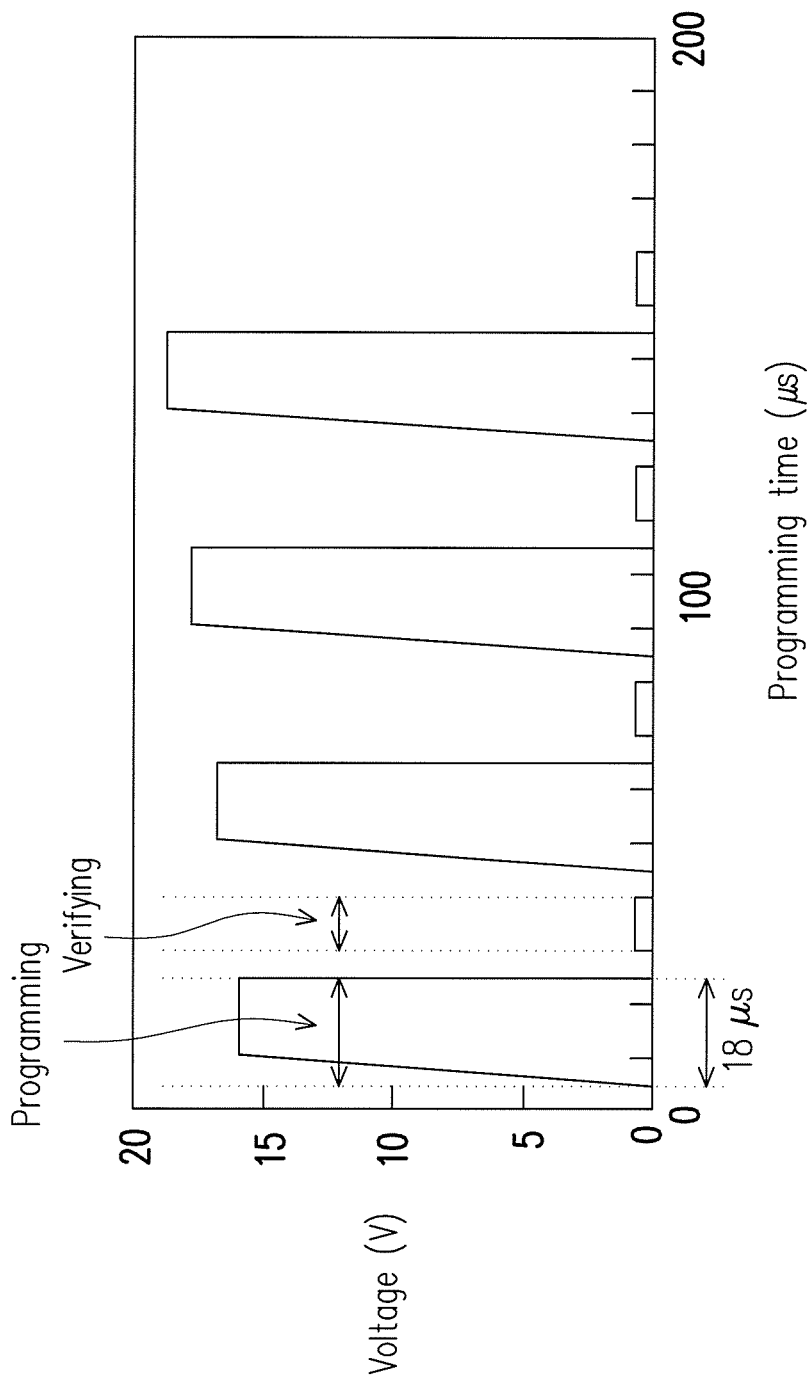
FIG. 7 illustrates a schematic diagram for programming the memory cells according to an exemplary embodiment.

FIG. 7 illustrates a schematic diagram for programming the memory cells according to an exemplary embodiment.

Referring to FIG. 7, in the present exemplary embodiment, the programming operation of the memory cell is completed by using a method of pulse writing/verifying threshold voltage. Specifically, if the data is to be written into the memory cells, the memory control circuit unit 104 sets an initial write voltage and a write voltage pulse time, and instructs the control circuit 2212 of the rewritable non-volatile memory module 106 to use the set initial write voltage and the write voltage pulse time to program the memory cell, so as to perform the data writing operation. Thereafter, the memory control circuit unit 104 uses a verifying voltage to verify the memory cells, so as determine whether the memory cells are in a correct storage state. If the memory cells are not programmed into the correct storage state, the memory control circuit unit 104 instructs the control circuit 2202 to use the currently-applied write voltage plus an Incremental-step-pulse programming (ISPP) adjusted value as a new write voltage (also know as a repeat write voltage) and program the memory cells again by using the new write voltage and the write voltage pulse time. Otherwise, if the memory cells are programmed into the correct storage state, it indicates that the data has been correctly written into the memory cells. For example, the initial voltage is set to 16 volts (V), the write voltage time is set to 18 microseconds (μs) and the ISPP adjusted value is set to 0.6V. However, the invention is not limited thereto.

Figure 8:
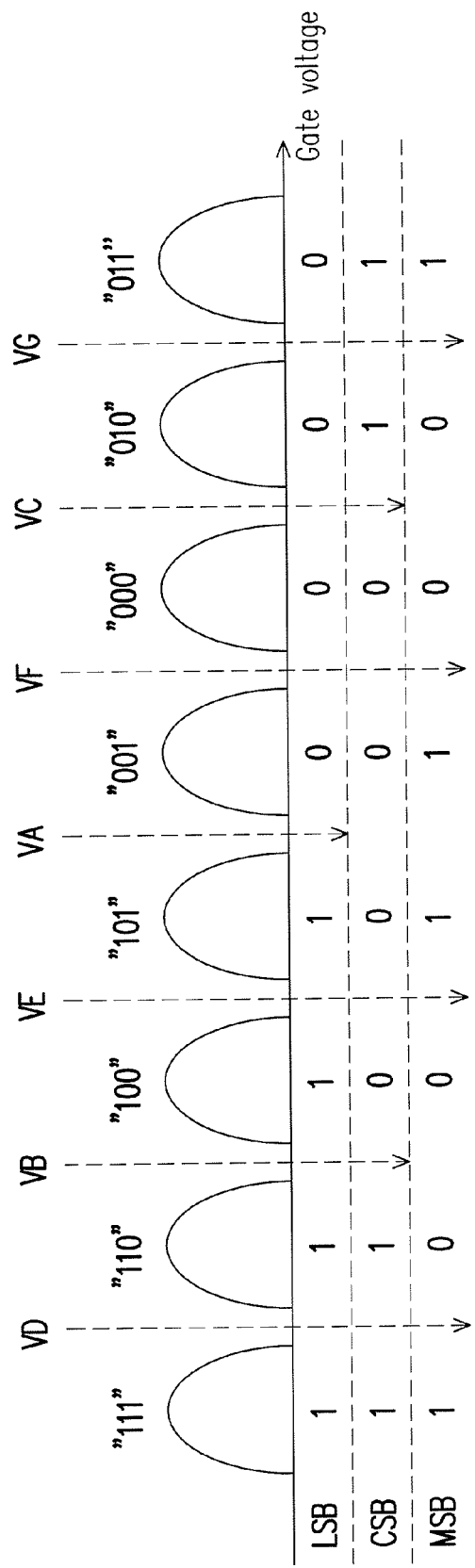
FIG. 8 illustrates a schematic diagram of reading data from a memory cell according to an exemplary embodiment.

Referring to FIG. 8, in a reading operation of the memory cells of the memory cell array 2202, a read voltage is applied to a control gate, and data stored in the memory cells can be identified according the on-state of the channel of the memory cell (a path used by the memory cell for electrically connecting the bit line with a source line, such as a path from a source to a drain of the memory cell).

FIG. 8 illustrates a schematic diagram of reading data from a memory cell according to an exemplary embodiment, which uses a TLC NAND flash memory as an example.

Referring to FIG. 8, in the rewritable non-volatile memory module 106, the storage state of the memory cell includes a least significant bit (LSB) which is a first bit counted from the left, a center significant bit (CSB) which is a second bit counted from the left and a most significant bit (MSB) which is a third bit counted from the left. Herein, the LSB is corresponding to a lower physical programming unit, the CSB is corresponding to a center physical programming unit and the MSB is corresponding to an upper physical programming unit. In this example, the gate voltage in each memory cell may be classified into 8 storage states (i.e., "111", "110", "100", "101", "001", "000", "010" and "011") according to a first preset read voltage VA, a second preset read voltage VB, a third preset read voltage VC, a fourth preset read voltage VD, a fifth preset read voltage VE, a sixth preset read voltage VF and a seventh preset read voltage VG. In particular, the memory cells arranged on the same word line can constitute three physical programming units. Herein, the physical programming units constituted by the LSBs of said memory cells are known as the lower physical programming unit, the physical programming units constituted by the CSBs of said memory cells are known as a center physical programming unit, and the physical programming units constituted by the MSBs of said memory cells are known as the upper physical programming unit.

FIG. 9, FIG. 10, FIG. 11 and FIG. 12 are schematic diagrams illustrating a management of the physical erasing unit according to an exemplary embodiment.

Figure 9:
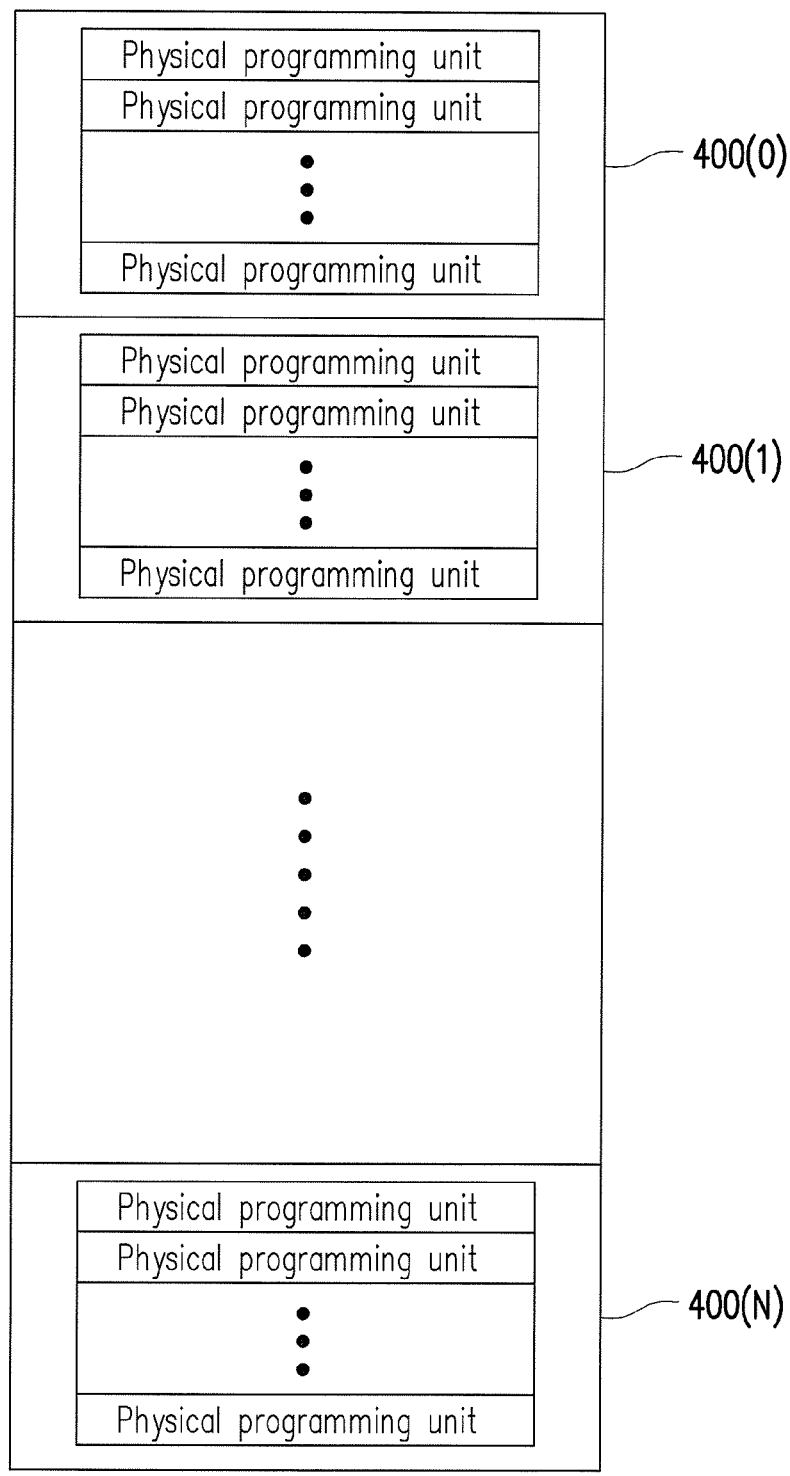

Referring to FIG. 9, the memory control circuit unit 104 (or the memory management circuit 202) performs a writing operation on the memory cells 702 of the rewritable non-volatile memory module 106 in units of the physical programming unit and performs an erasing operation on the memory cells 702 of the rewritable non-volatile memory module 106 in units of the physical erasing unit. Specifically, the memory cells 702 of the rewritable non-volatile memory module 106 constitute a plurality of physical programming units, and the physical programming units constitute a plurality of physical erasing units 400(0) to 400(N). The physical erasing unit is the minimal unit for erasing. Namely, each physical erasing unit contains the least number of memory cells to be erased together. The physical programming unit is the minimum unit for programming. That is to say, one programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). For example, in the rewritable non-volatile memory module 106 which belongs to the TLC NAND flash memory, one lower physical programming unit is constituted by the LSBs of the memory cells located on the same bit line; one center physical programming unit is constituted by the CSBs of the memory cells located on the same bit line; and one upper physical programming unit is constituted by the MSBs of the memory cells located on the same bit line. In other words, the physical programming units in the physical erasing unit of the rewritable non-volatile memory module 106 may be classified into the lower physical programming units, the center physical programming units and the upper physical programming units.

Figure 11:
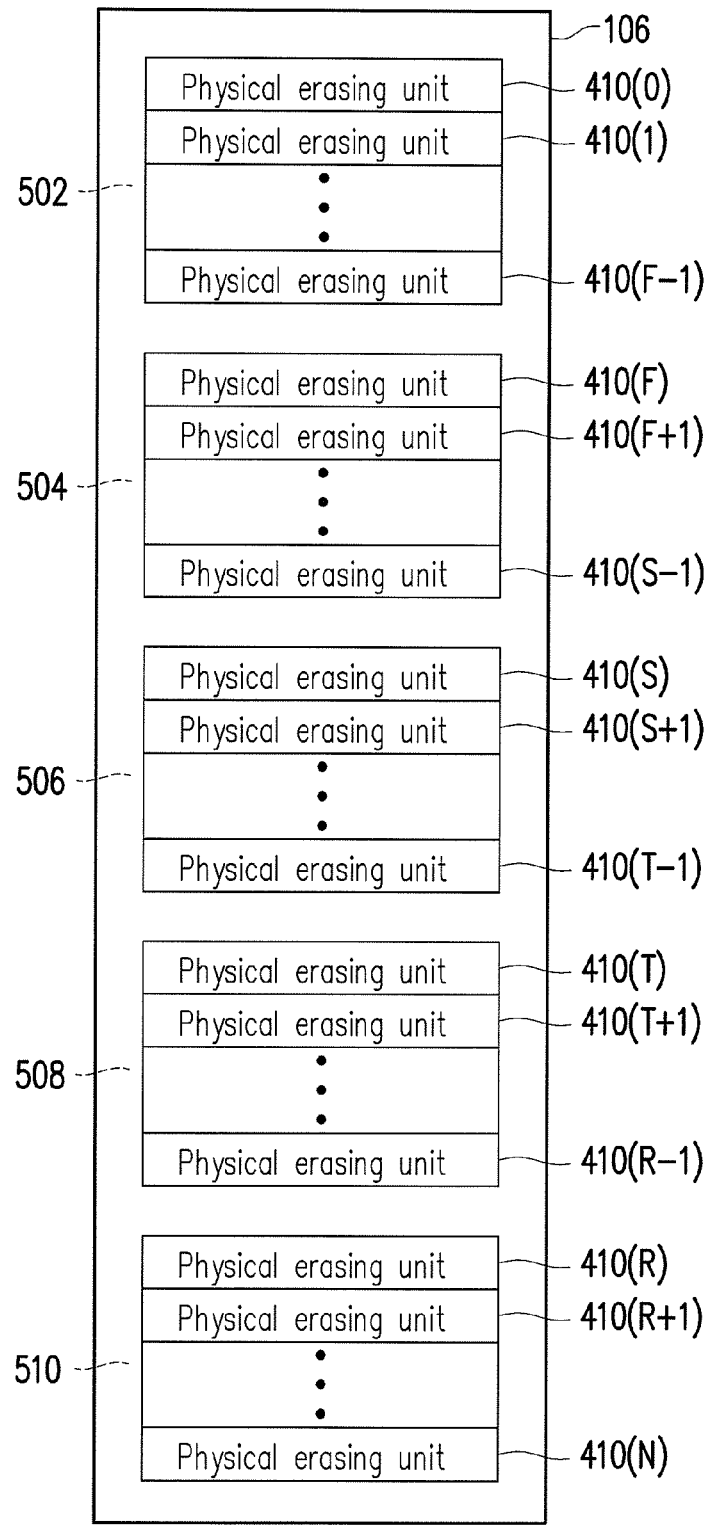

Referring to FIG. 11, in the present exemplary embodiment, the memory control circuit unit 104 (or the memory management circuit 202) may logically group the physical erasing units 410(0) to 410(N) into a data area 502, a spare area 504, a system area 506, a temporary area 508 and a replacement area 510.

The physical erasing units logically belonging to the data area 502 and the spare area 504 are configured to store data from the host system 1000. More specifically, the physical erasing units of the data area 502 are regarded as the physical erasing units stored with the data, whereas the physical erasing units of the spare area 504 are configured to replace the physical erasing units of the data area 502. In other words, if the write command and the data to be written are received from the host system 1000, the memory control circuit unit 104 (or the memory management unit 202) gets the physical erasing units from the spare area 504, and writes the data into the selected physical erasing units in order to replace the physical erasing units in the data area 502.

The physical erasing units logically belonging to the system area 506 are configured to record system data. For example, the system data includes information related to manufacturer and model of the rewritable non-volatile memory module, a number of physical erasing units in the rewritable non-volatile memory module, a number of the physical programming units in each physical erasing unit, a firmware code of the memory storage apparatus 100 and so on.

The physical erasing units logically belonging to the temporary area 508 is configured to temporally store data written from the host system 1000.

The physical erasing units logically belonging to the replacement area 510 are used in a bad physical erasing unit replacement procedure for replacing damaged physical erasing units. More specifically, if available physical erasing units still exists in the replacement area 510 if the physical erasing units of the data area 502 are damaged, the memory management circuit 202 gets the available physical erasing units from the replacement area 510 for replacing the damaged physical erasing units.

Particularly, the numbers of the physical erasing units in the data area 502, the spare area 504, the system area 506, the temporary area 508 and the replacement area 510 may be different from one another according to the different memory specifications. In addition, it should be understood that, during operations of the memory storage apparatus 100, grouping relations of the physical erasing units for associating with the data area 502, the spare area 504, the system area 506, the temporary area 508 and replacement area 510 may be dynamically changed. For example, if the damaged physical erasing units in the spare area 504 are replaced by the physical erasing units in the replacement area 510, the physical erasing units originally from the replacement area 510 are then associated with the spare area 504. For example, if the physical erasing units are not assigned to the temporary area 508 in a formatting process, if the writing operation is performed, the memory management circuit 202 can get the physical erasing unit from the spare area 504 to temporarily store data, and the physical erasing unit used to temporarily store the data are regarded as belonging to the temporary area 508.

Figure 12:
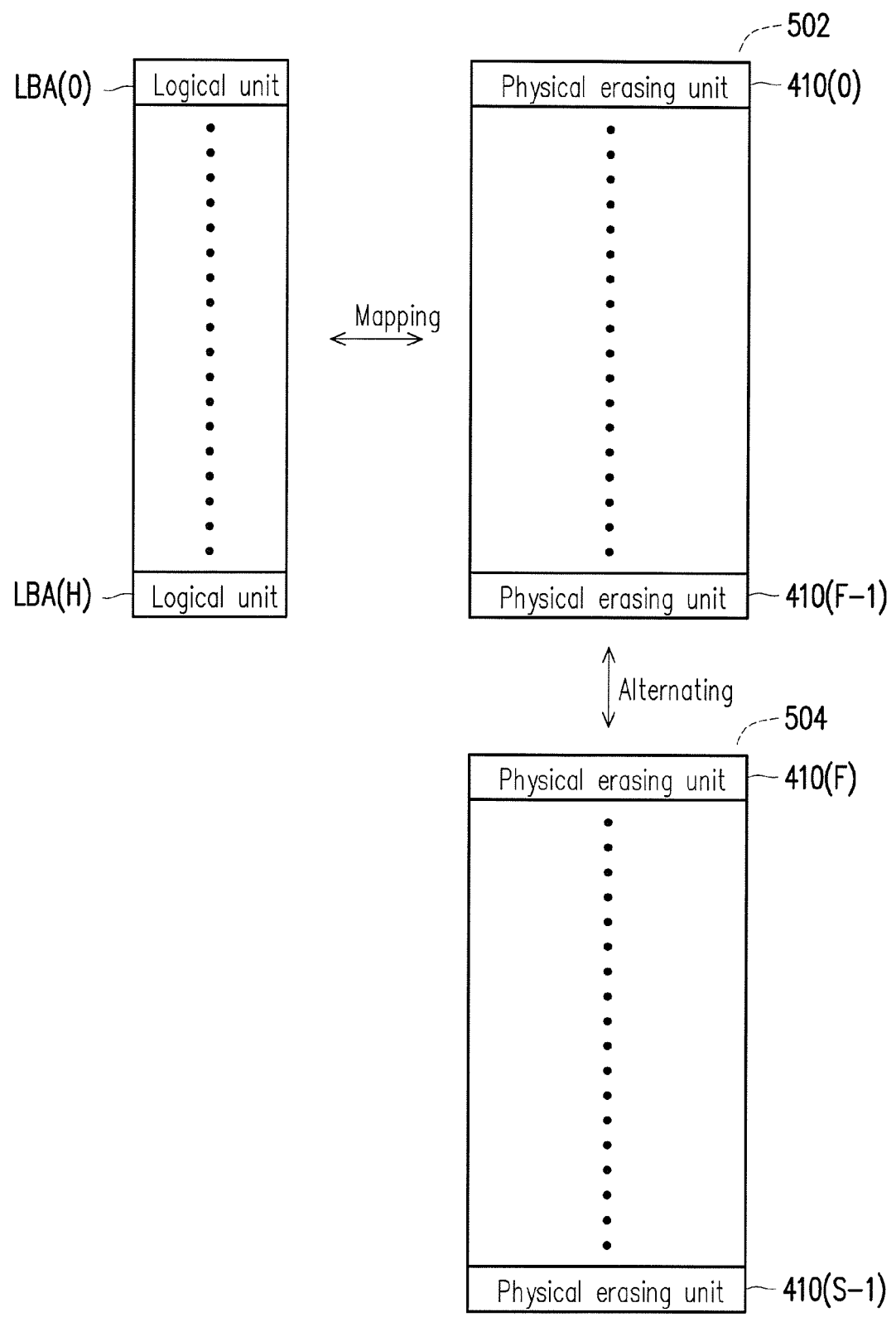

Referring to FIG. 12, the memory control circuit unit 104 (or the memory management circuit 202) is assigned with logical units LBA(0) to LBA(H) to map the physical erasing units in the data area 502. Each of the logical units has a plurality of logical sub-units to be mapped to the physical programming units of the corresponding physical erasing unit. Further, if the host system 1000 intends to write the data into the logical units or update the data stored in the logical units, the memory control circuit unit 104 (or the memory management unit 202) may get one physical erasing units from the spare area 504 for writing the data as an alternately exchange of the physical erasing units of the data area 502. In this exemplary embodiment, the logical sub-units may be logical pages or logical sectors.

In order to identify which of the physical erasing units is stored with the data of each logical unit, the memory control circuit unit 104 (or the memory management circuit 202) may record the mapping relations between the logical units and the physical erasing units in the present exemplary embodiment. Further, if the host system 1000 intends to access the data in the logical sub-unit, the memory control circuit unit 104 (or the memory management circuit 202) may first confirm the logical unit to which that logical sub-unit belongs, and issue a corresponding command sequence to access the data in the physical erasing units mapped to the logical unit. For instance, in the present exemplary embodiment, the memory control circuit unit 104 (or the memory management circuit 202) may store a logical-to-physical address mapping table into the rewritable non-volatile memory module 106 for recording the physical erasing units mapped to each of the logical units, and the logical-to-physical address mapping table are loaded into the buffer memory 208 for maintenance if the memory control circuit unit 104 (or the memory management circuit 202) intends to the access the data.

Figure 13:
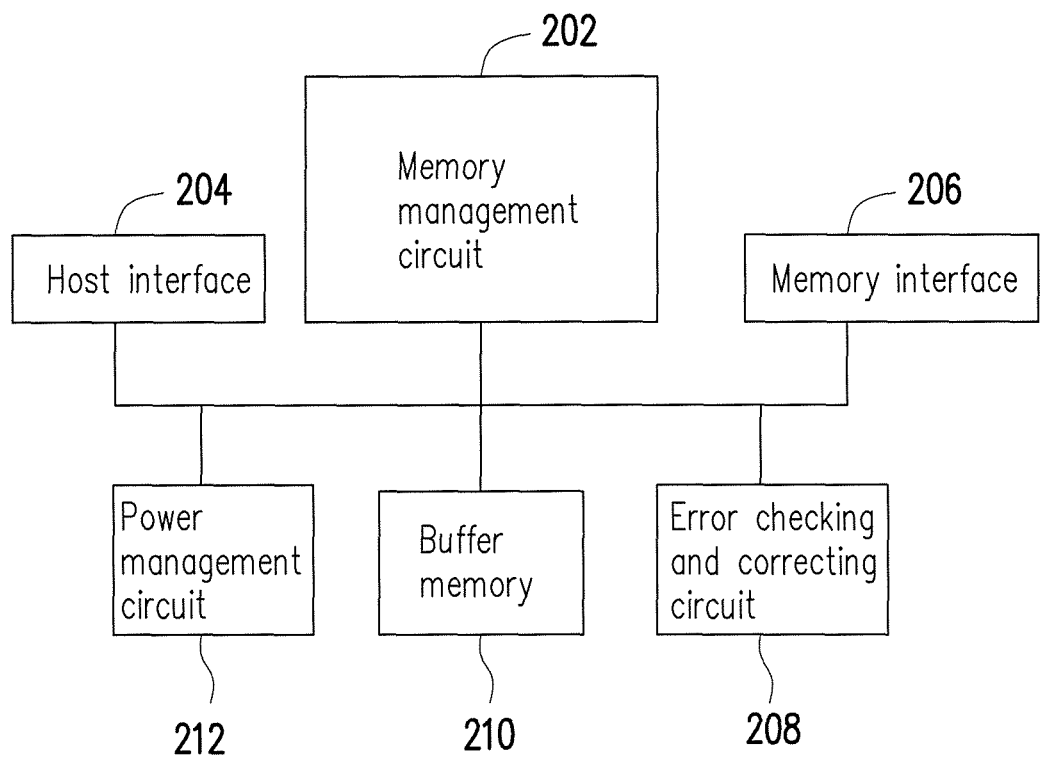
FIG. 13 is a schematic block diagram illustrating a memory control circuit unit according to an exemplary embodiment.

FIG. 13 is a schematic block diagram illustrating a memory control circuit unit according to an exemplary embodiment. It should be understood that, the structure of the memory control circuit unit depicted in FIG. 13 is only an example, and the invention is not limited thereto.

Referring to FIG. 13, the memory control circuit unit 104 includes a memory management circuit 202, a host interface 204, a memory interface 206 and an error checking and correcting circuit 208.

The memory management circuit 202 is configured to control overall operations of the memory control circuit unit 104. Specifically, the memory management circuit 202 has a plurality of control commands. During operations of the memory storage apparatus 100, the control commands are executed to execute various operations such as writing, reading and erasing data.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. During operations of the memory storage apparatus 100, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), the read only memory (not illustrated) and a random access memory (not illustrated). Particularly, the read only memory has an activate code, which is executed by the microprocessor unit to load the control commands stored in the rewritable non-volatile memory module 106 to the random access memory of the memory management circuit 202 if the memory control circuit unit 104 is enabled. Thereafter, the control commands are executed by the microprocessor unit to execute operations of writing, reading or erasing data.

Further, in another exemplary embodiment of the invention, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 106; the memory writing circuit is configured to issue a write command to the rewritable non-volatile memory module 106 in order to write data into the rewritable non-volatile memory module 106; the memory reading circuit is configured to issue a read command to the rewritable non-volatile memory module 106 in order to read data from the rewritable non-volatile memory module 106; the memory erasing circuit is configured to issue an erase command to the rewritable non-volatile memory module 106 in order to erase data from the rewritable non-volatile memory module 106; the data processing circuit is configured to process both the data to be written to the rewritable non-volatile memory module 106 and the data to be read from the rewritable non-volatile memory module 106.

The host interface 204 is coupled to the memory management circuit 202 and configured for receiving and identifying commands and data sent from the host system 1000. In other words, the commands and data sent from the host system 1000 are passed to the memory management circuit 202 through the host interface 204. In the present exemplary embodiment, the host interface 204 is compatible with a USB standard. However, it is to be understood that the invention is not limited thereto. The host interface 204 may also be a PATA standard, an IEEE 1394 standard, a PCI Express standard, a SD standard, a SATA standard, a UHS-I interface standard, a UHS-II interface standard, a MS standard, a MMC standard, an eMMC interface standard, a UFS interface standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

The error checking and correcting (ECC) circuit 208 is coupled to the memory management circuit 202 and configured for executing an error correcting procedure to ensure the accuracy of data. Specifically, if the memory management circuit 202 reads data from the rewritable non-volatile memory module 106, the error checking and correcting circuit 208 performs an error correction procedure on the read data. For example, in the present exemplary embodiment, the error checking and correcting circuit 208 is a low density parity check (LDPC) circuit which stores a log likelihood ratio (LLR) value look-up table. If the memory management circuit 202 reads data from the rewritable non-volatile memory module 106, the error checking and correcting circuit 208 performs the error correction procedure according to the read data and corresponding LLR values in said look-up table. It should be noted that, in another exemplary embodiment, the error checking and correcting circuit 208 may also be a Turbo Code circuit.

In an exemplary embodiment of the invention, the memory control circuit unit 104 further includes a buffer memory 210 and a power management circuit 212.

The buffer memory 210 is coupled to the memory management circuit 202 and configured to temporarily store data and commands from the host system 1000 or data from the rewritable non-volatile memory module 106.

The power management unit 212 is coupled to the memory management circuit 202 and configured to control a power of the memory storage apparatus 100.

In the exemplary embodiment of the invention, if the host system 1000 intends to store data into the logical unit, the memory control circuit unit 104 (or the memory management circuit 202) first temporarily stores data into one physical erasing unit. Specifically, if a write command instructing to store data into the logical unit is received from the host system 1000, the memory control circuit unit 104 (or the memory management circuit 202) first uses a single-page mode to temporarily store data into the lower physical programming unit of one physical erasing unit. Then, the memory control circuit unit 104 (or the memory management circuit 202) uses a multi-page mode to write the data temporarily stored in aforesaid physical erasing unit into another physical erasing unit and maps the logical unit to the another physical erasing unit.

Herein, so-called single-page mode refers to storing only one bit data in the memory cell. In other words, for the memory cell capable of storing multiple bis, in the single-page mode, the memory control circuit unit 104 (or the memory management circuit 202) performs the writing operation of data only on the lower physical programming unit. The so-called multi-page mode refers to use of the lower physical programming unit, the center physical programming unit and the upper physical programming unit for storing data. In other words, for the memory cell capable of storing multiple bits, if the multi-page mode is used for writing data, the memory control circuit unit 104 (or the memory management circuit 202) programs the lower physical programming unit, the center physical programming unit and the upper physical programming unit of one physical programming unit group.

In the exemplary embodiment, the memory control circuit unit 104 (or the memory management circuit 202) uses one area (also known as a write data buffer area) in the buffer memory 210 to temporarily store the write data, and the size of the write data buffer area is equal to the size of one physical programming unit. In particular, during the process of writing data from the write data buffer area of the buffer memory 210 into one physical erasing unit, if a programming error occurs if programming the memory cells on one word line layer and one bit line set, a data loss may occur on the memory cells of the adjacent word line layer and said bit line set. In the present exemplary embodiment, during the process of writing data into the physical erasing unit, each time if the memory control circuit unit 104 (or the memory management circuit 202) issues a command sequence for applying voltage to one of the word line layers in order to perform the programming operation, only one of the bit line sets is selected for action, so as to program the memory cells corresponding to one physical programming unit on said word line layer. Further, in consideration of the data loss on the memory cells of the adjacent word line layer if the programming error occurs, after programming the memory cells on the word line layer and one bit line sets, the memory control circuit unit 104 (or the memory management circuit 202) can continue to program the memory cells on another non-adjacent word line layer and said bit line set. In other words, the memory control circuit unit 104 (or the memory management circuit 202) alternately programs the memory cells at intersection of the same bit line set with respect to the word line layers.

Figure 14:
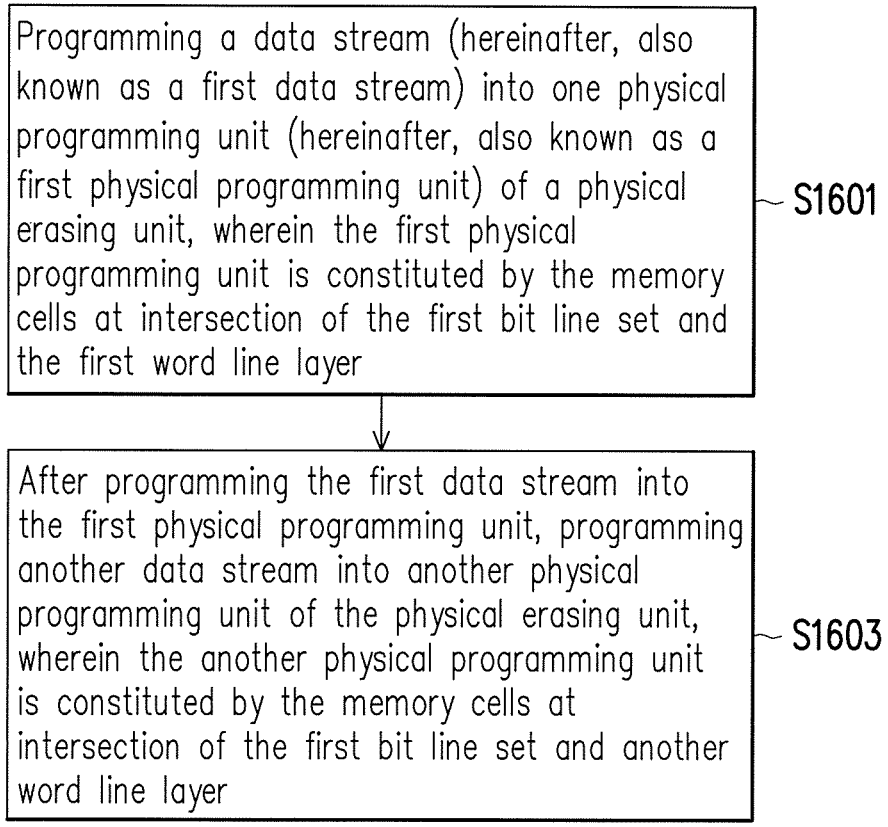
FIG. 14 is a flowchart illustrating a memory programming method according to an exemplary embodiment of the invention.
Figure 15:
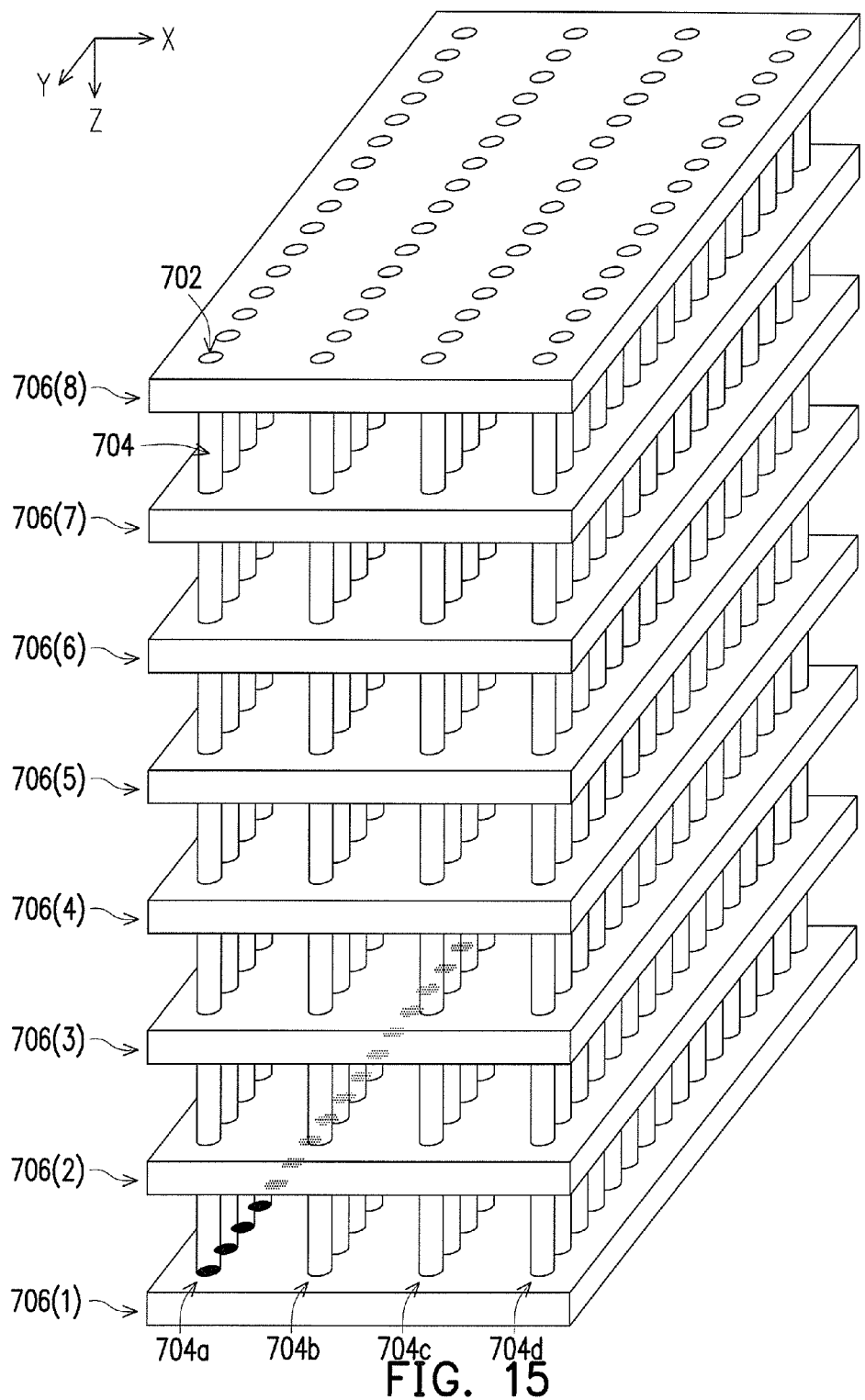
FIGS. 15 to 22 are schematic diagrams illustrating an example of programming data into the physical erasing unit by using the single-page mode according to the first exemplary embodiment of the invention.
Figure 16:
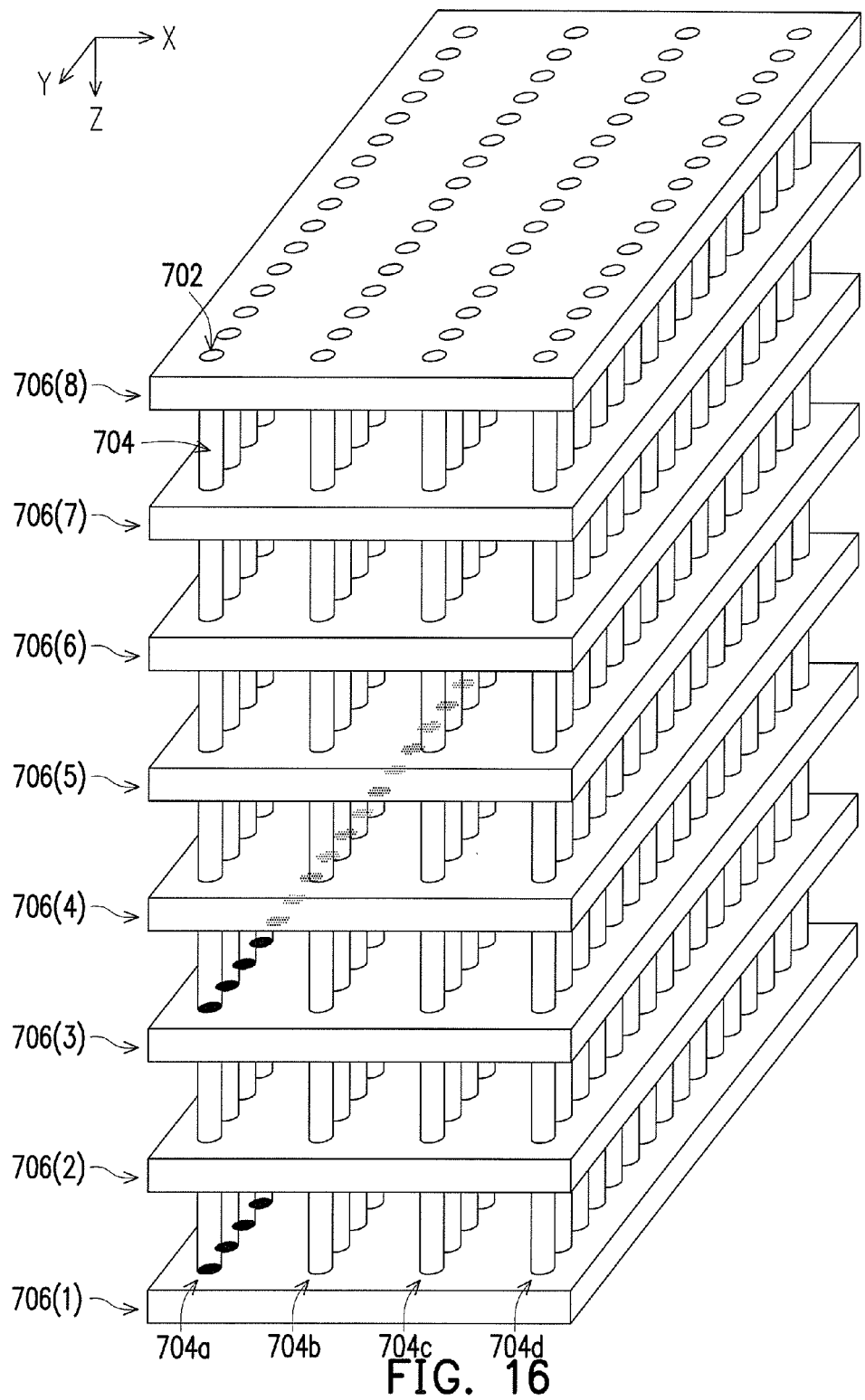
Figure 17:
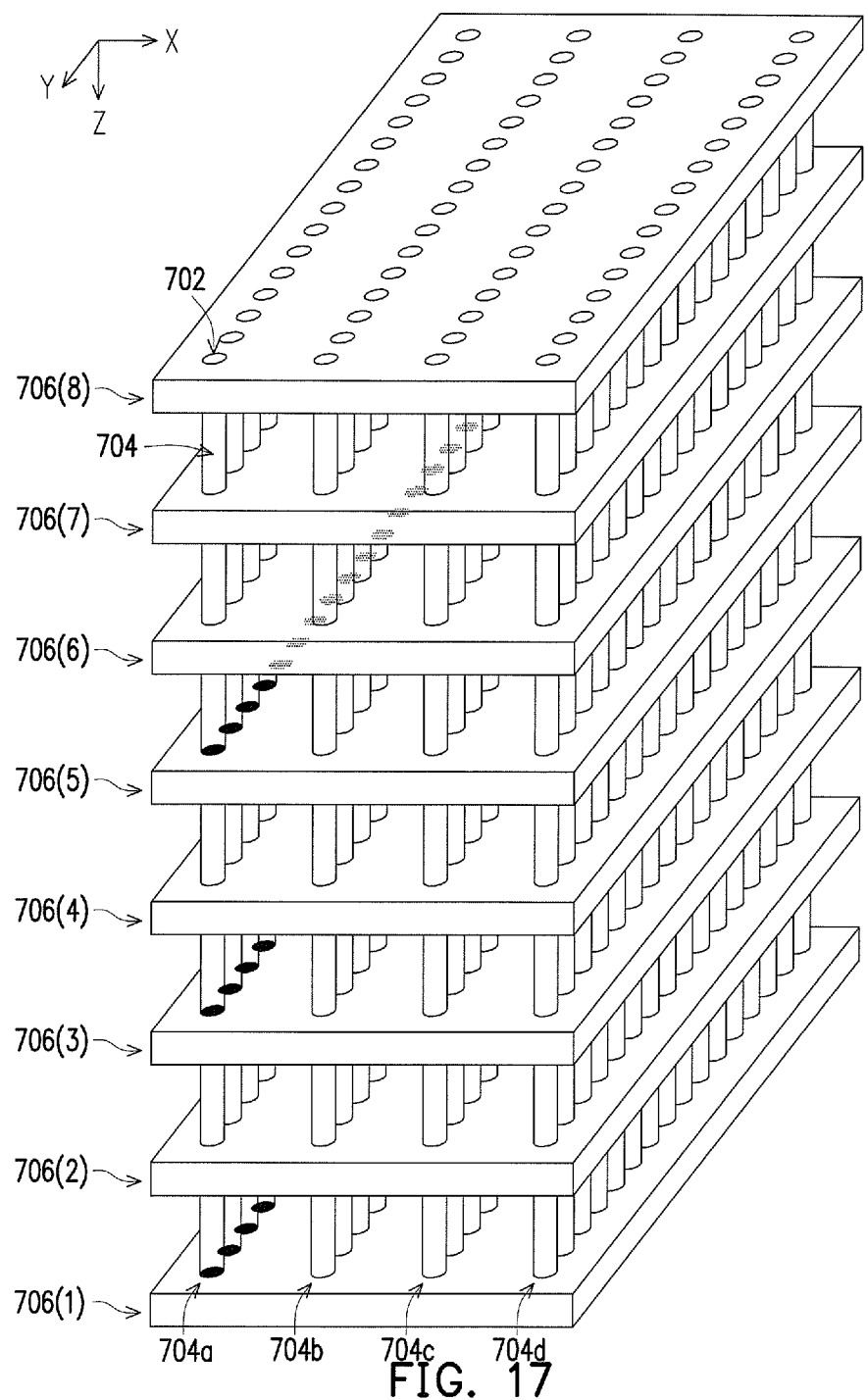
Figure 18:
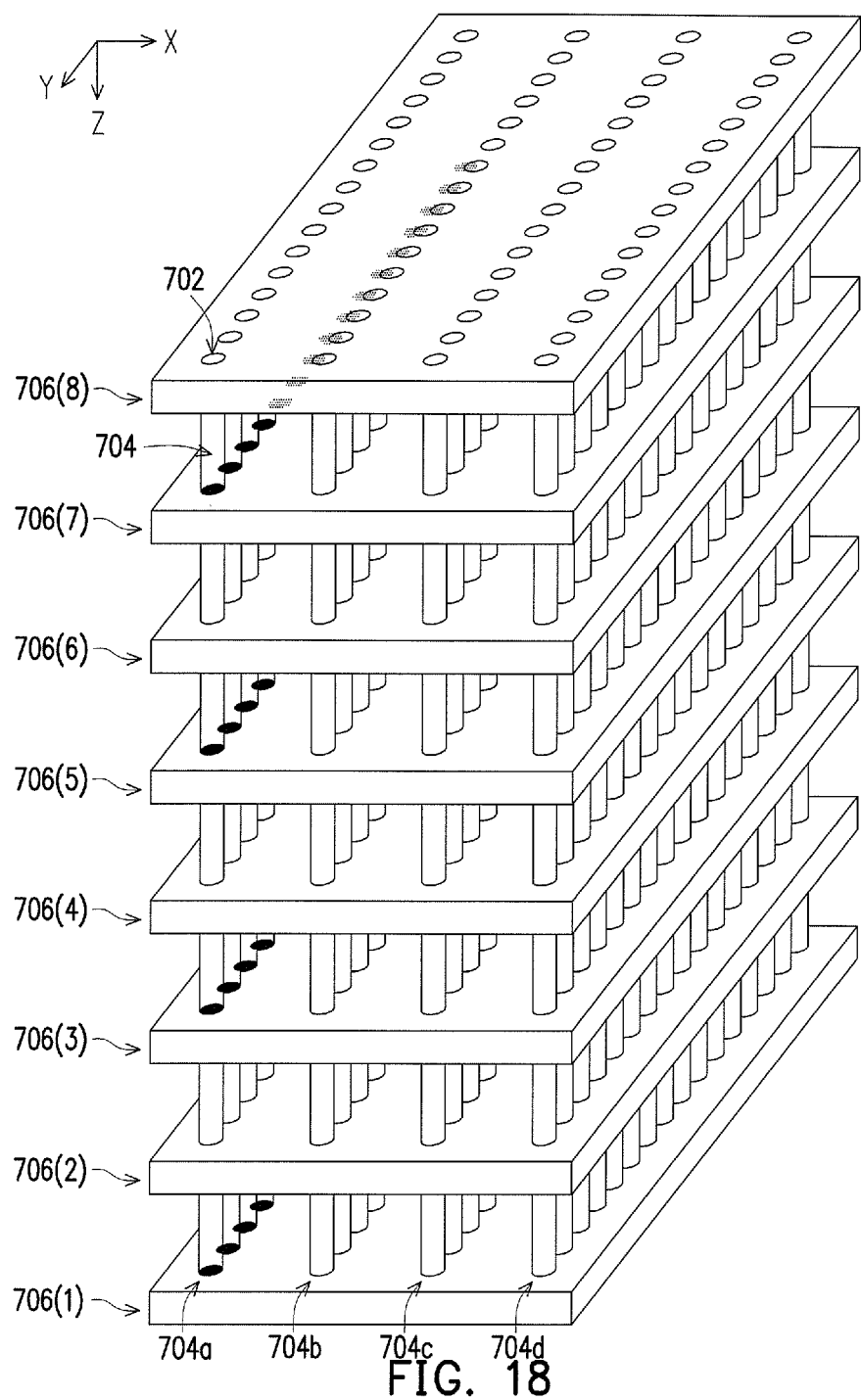
Figure 19:
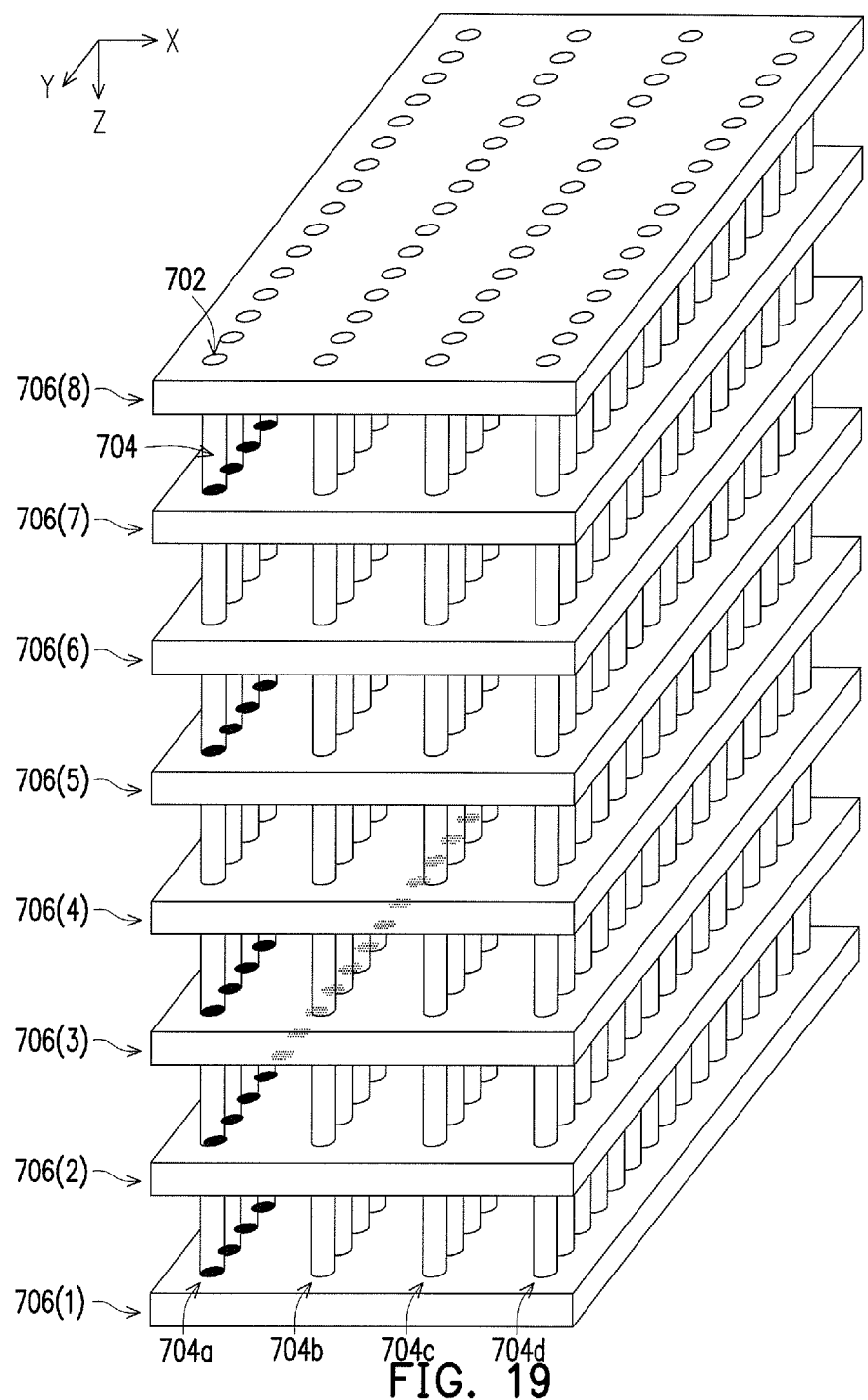
Figure 20:
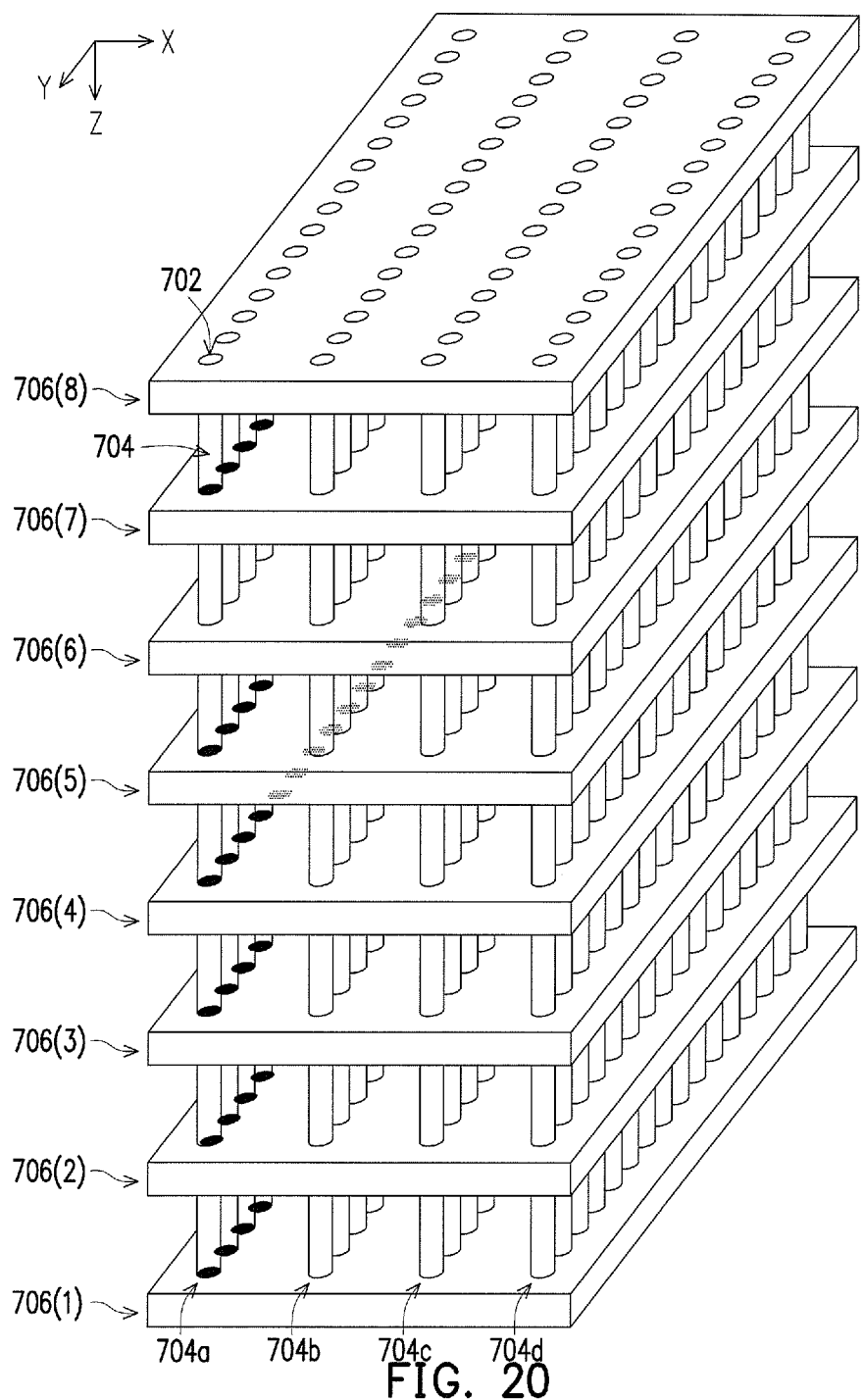
Figure 21:
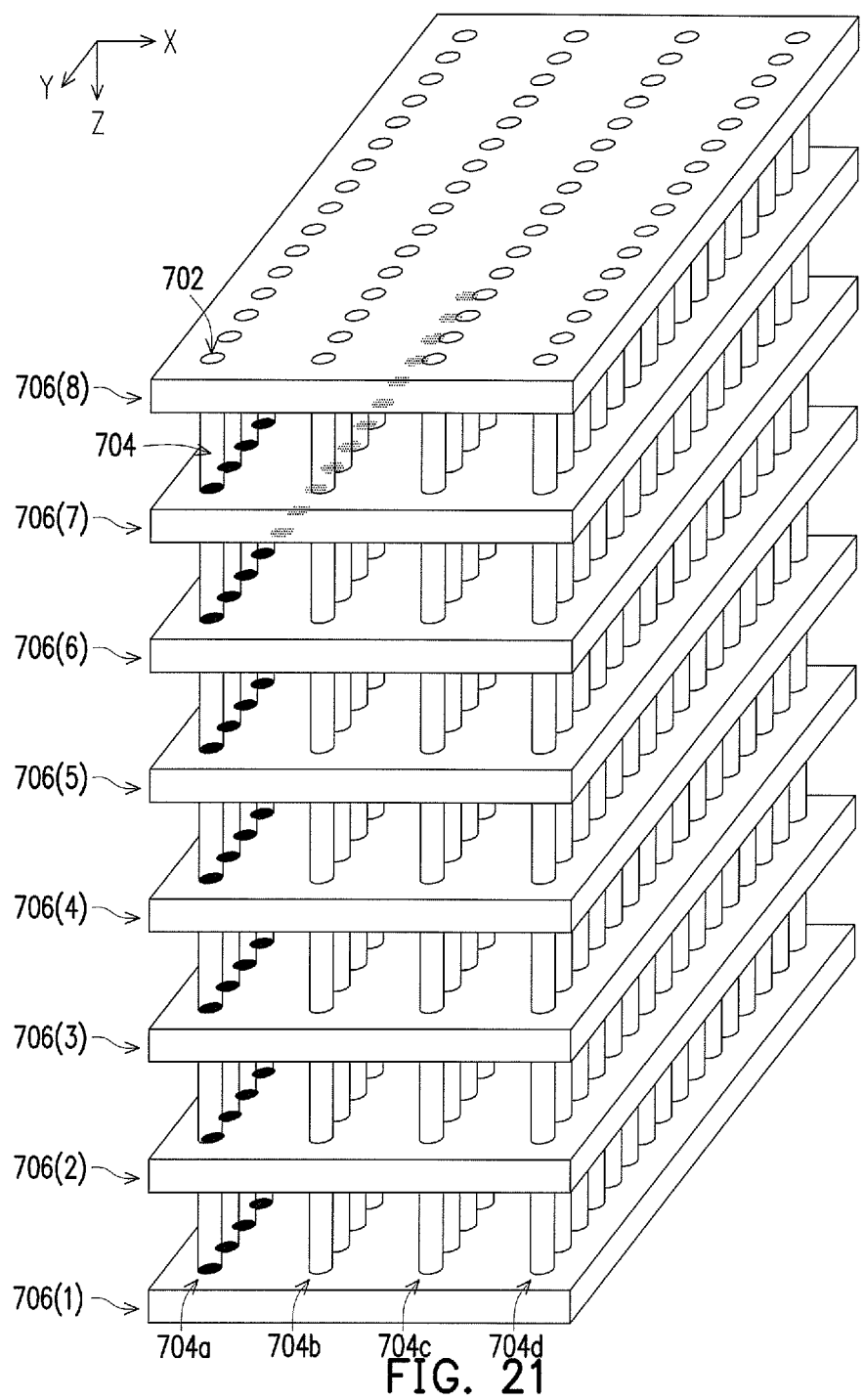
Figure 22:
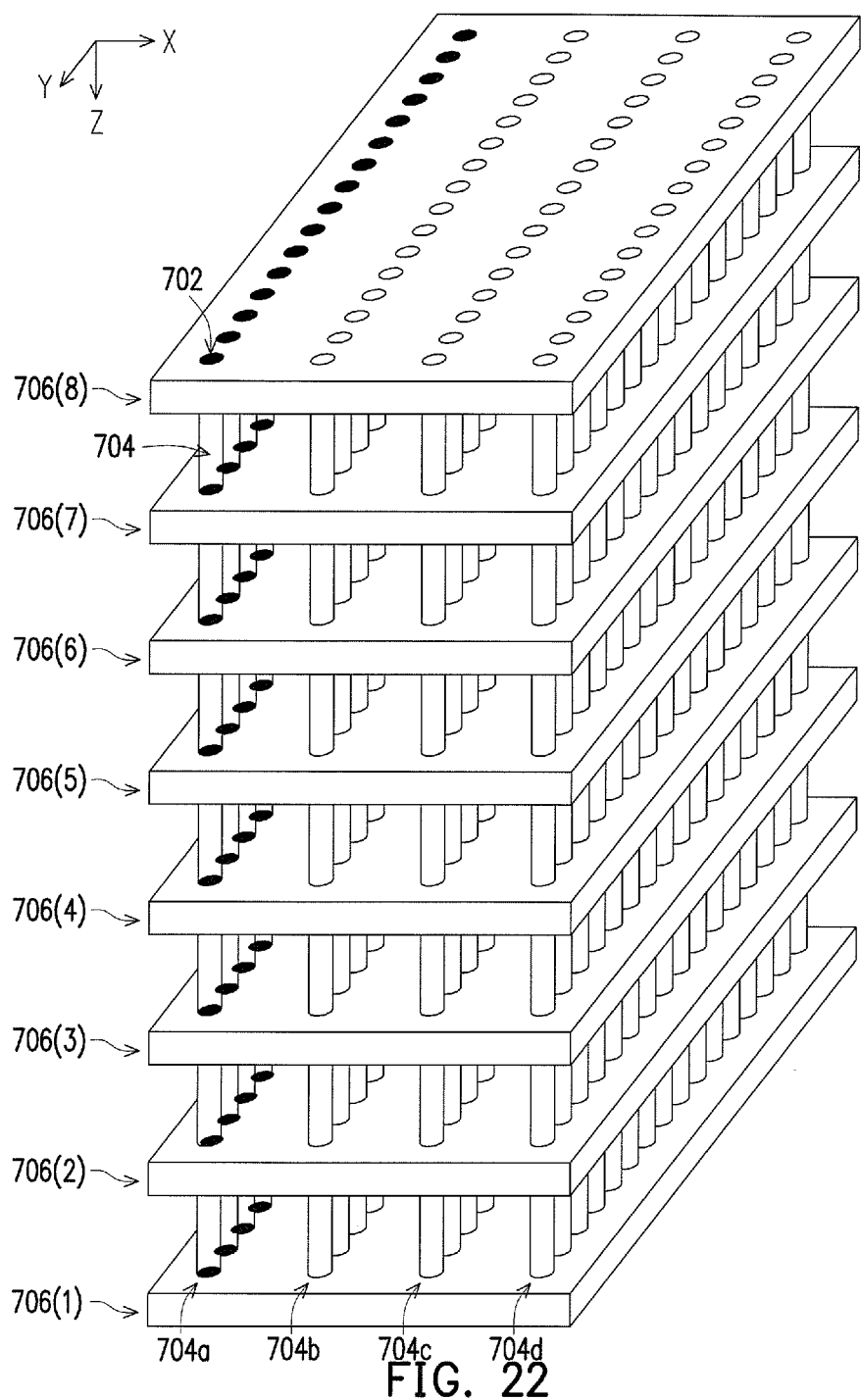
Figure 23:
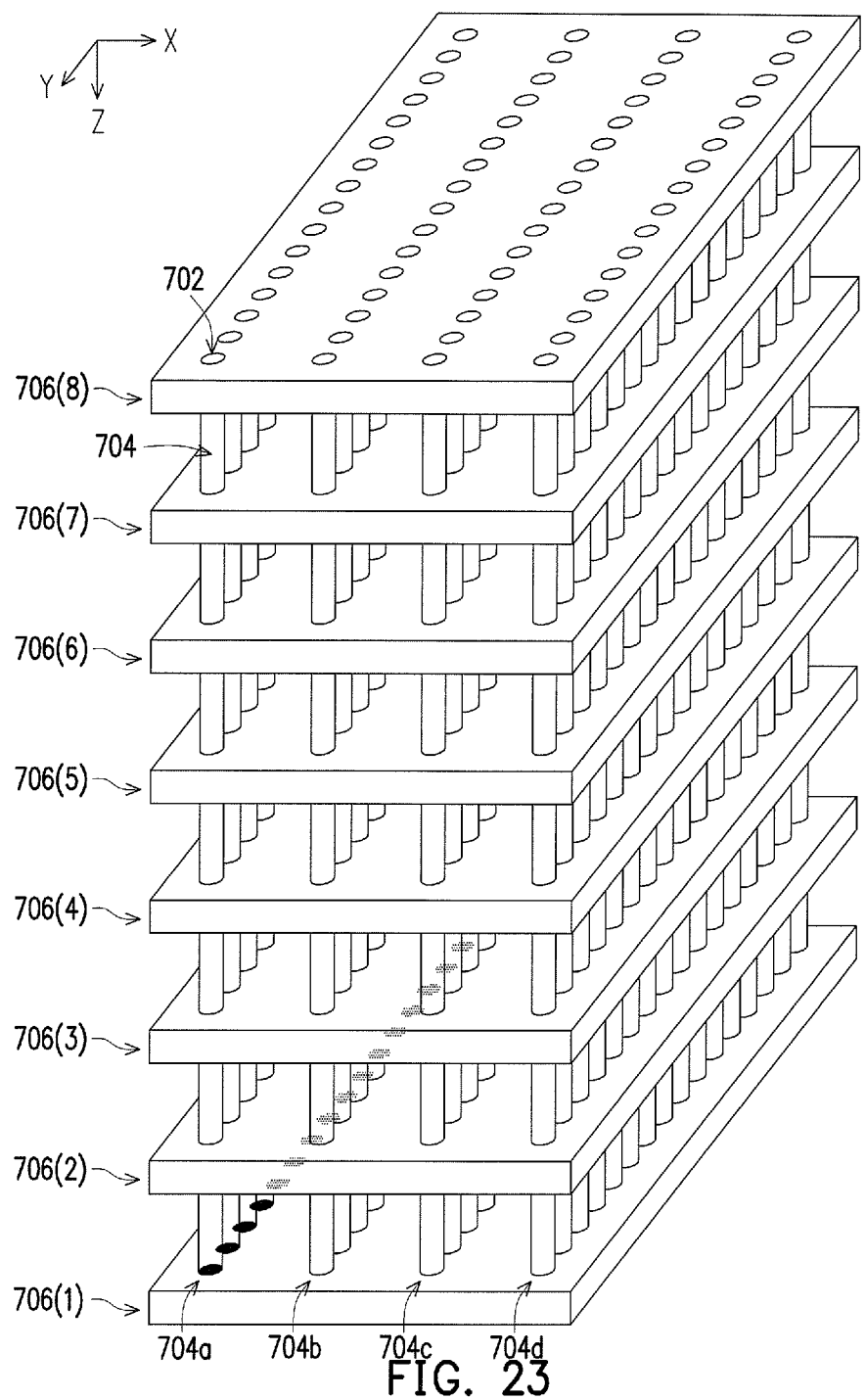
FIGS. 23 to 30 are schematic diagrams illustrating an example of programming data into the physical erasing unit by using the single-page mode according to the second exemplary embodiment of the invention.
Figure 24:
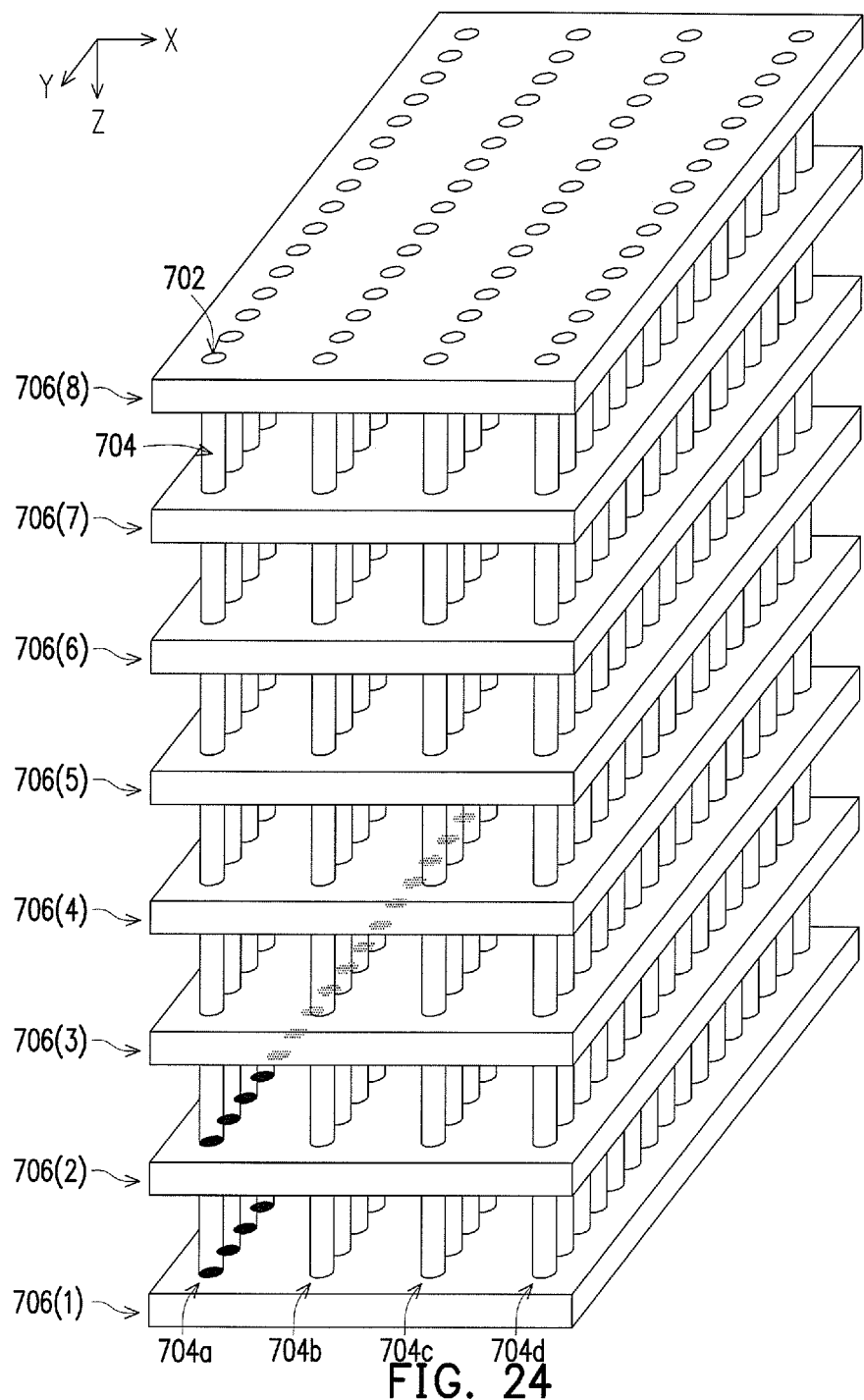
Figure 25:
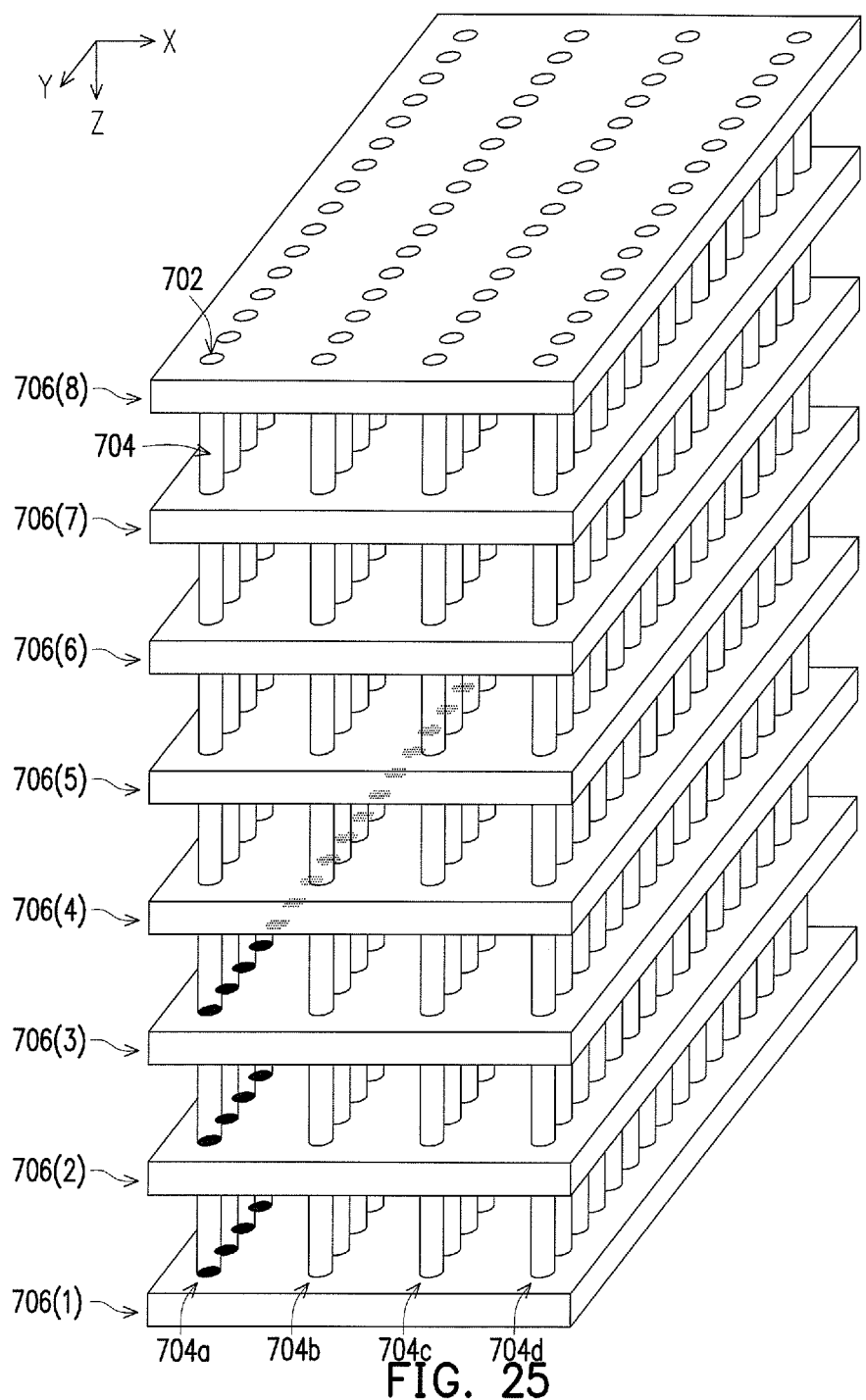
Figure 26:
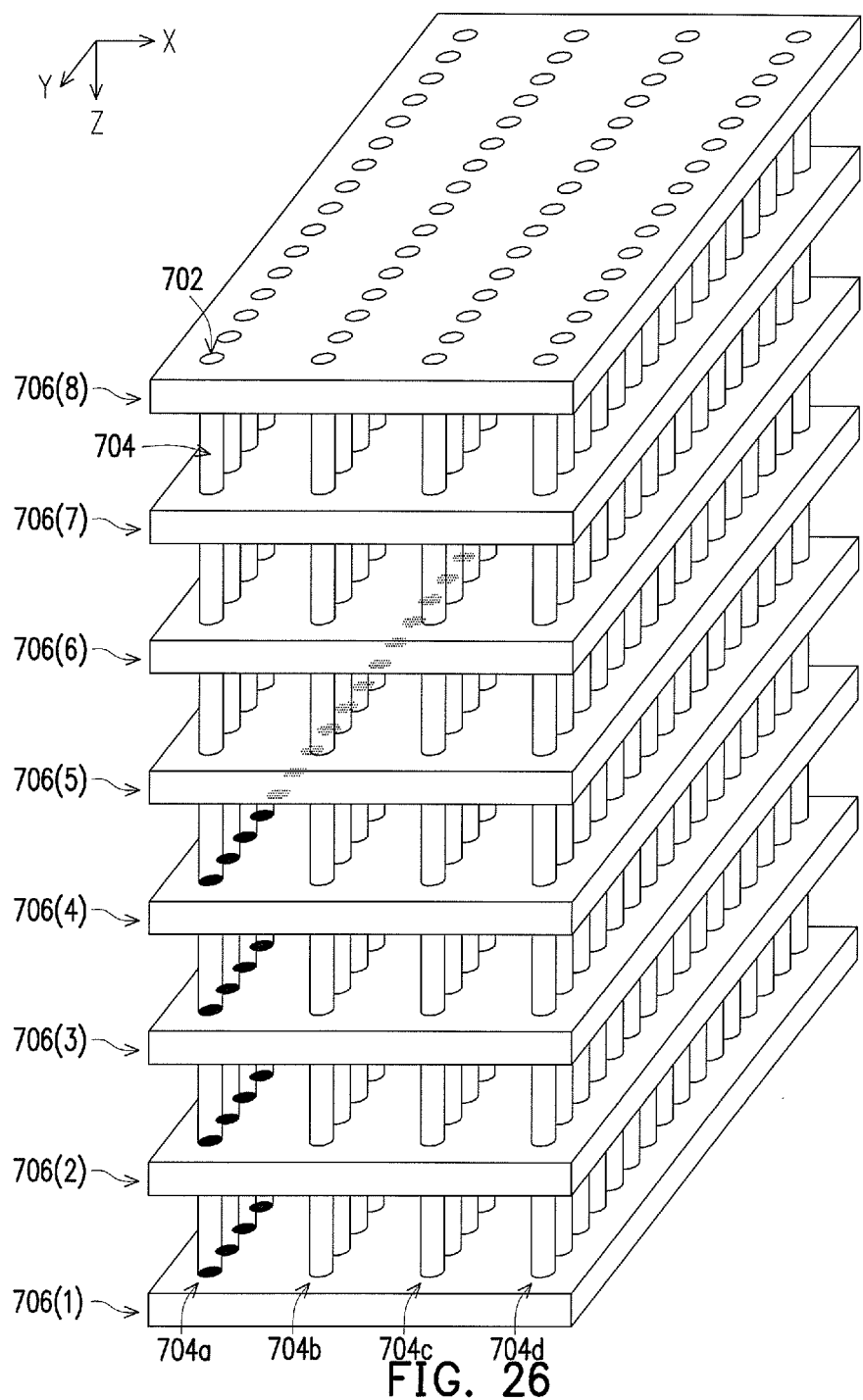
Figure 27:
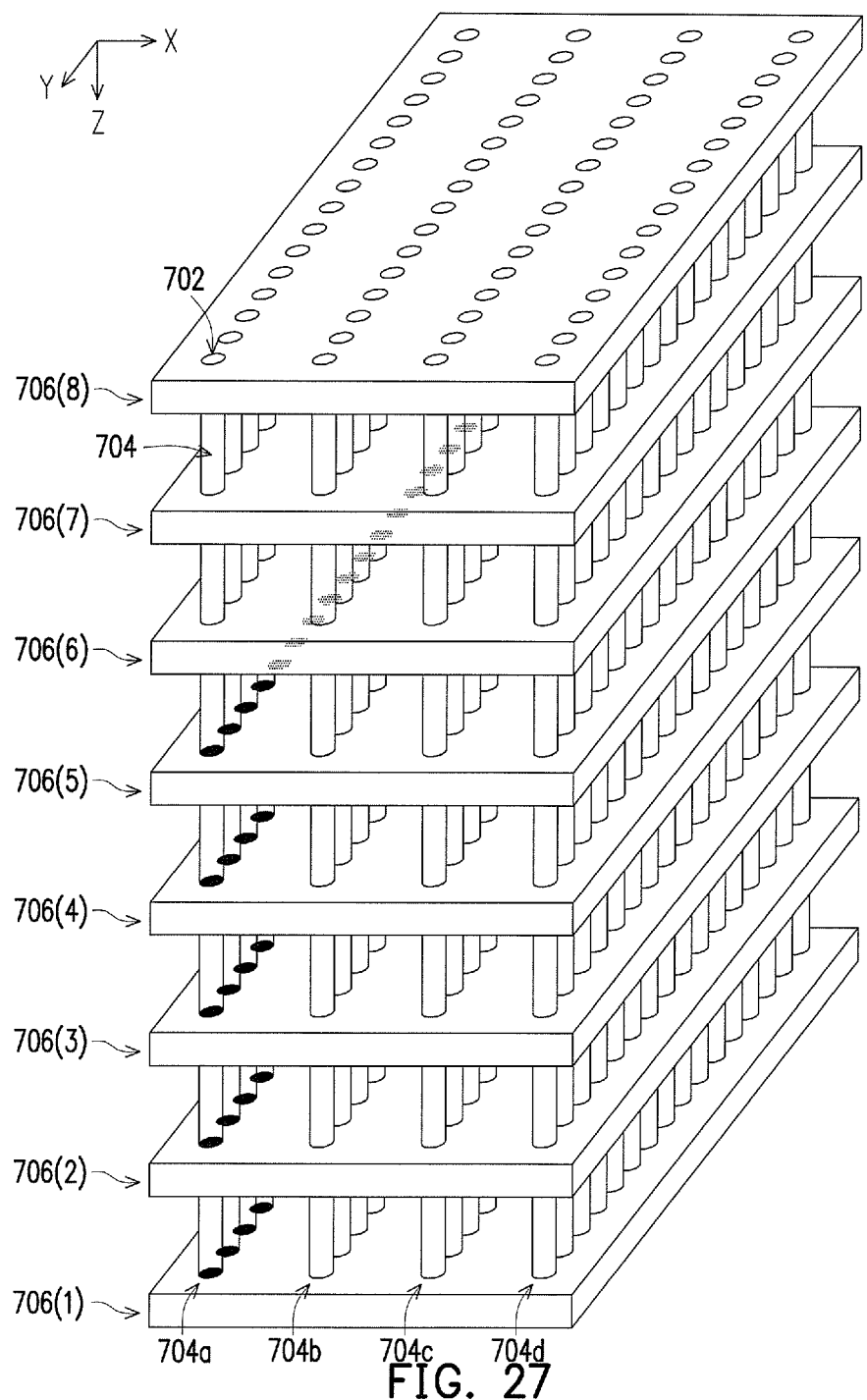
Figure 28:
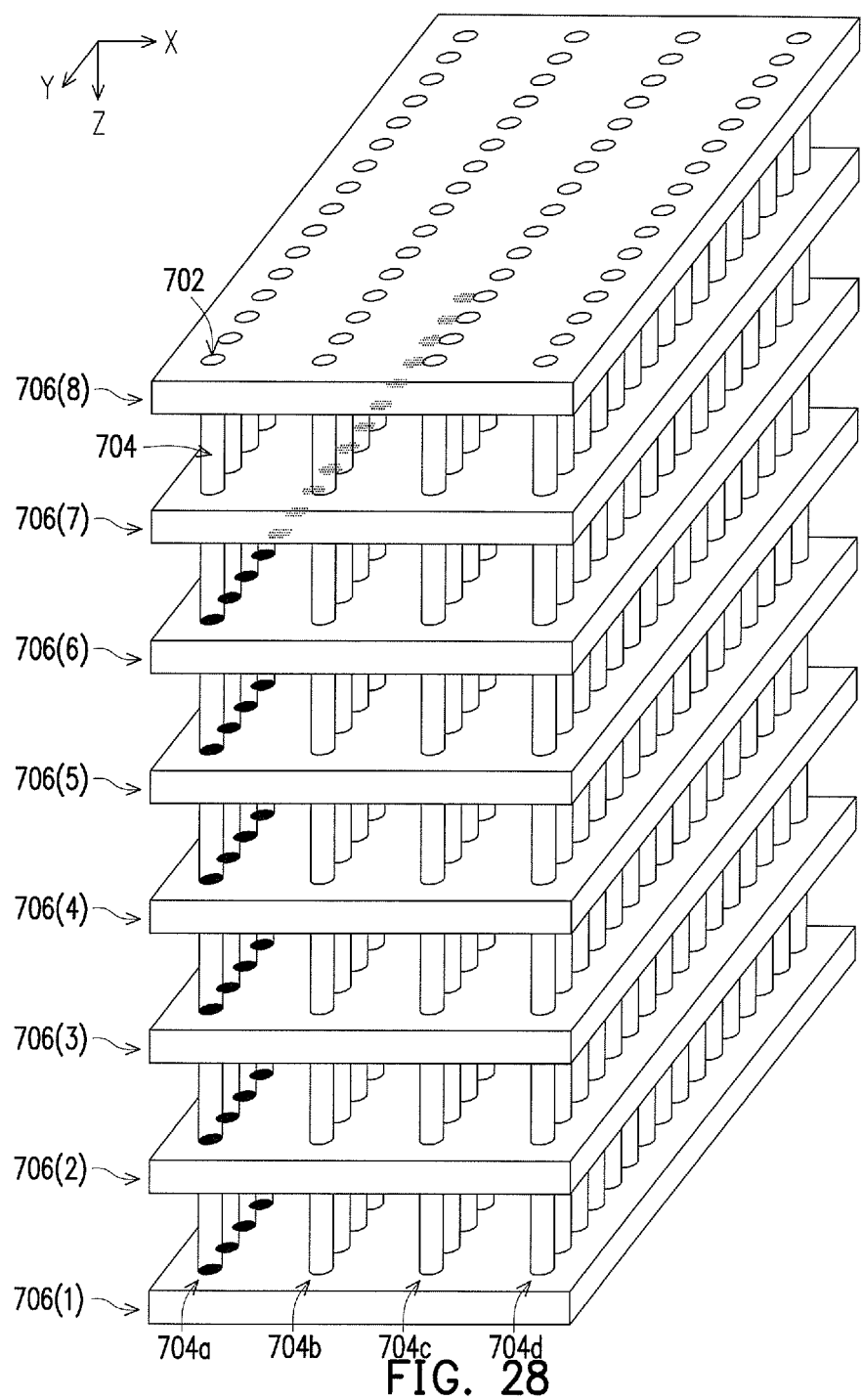
Figure 29:
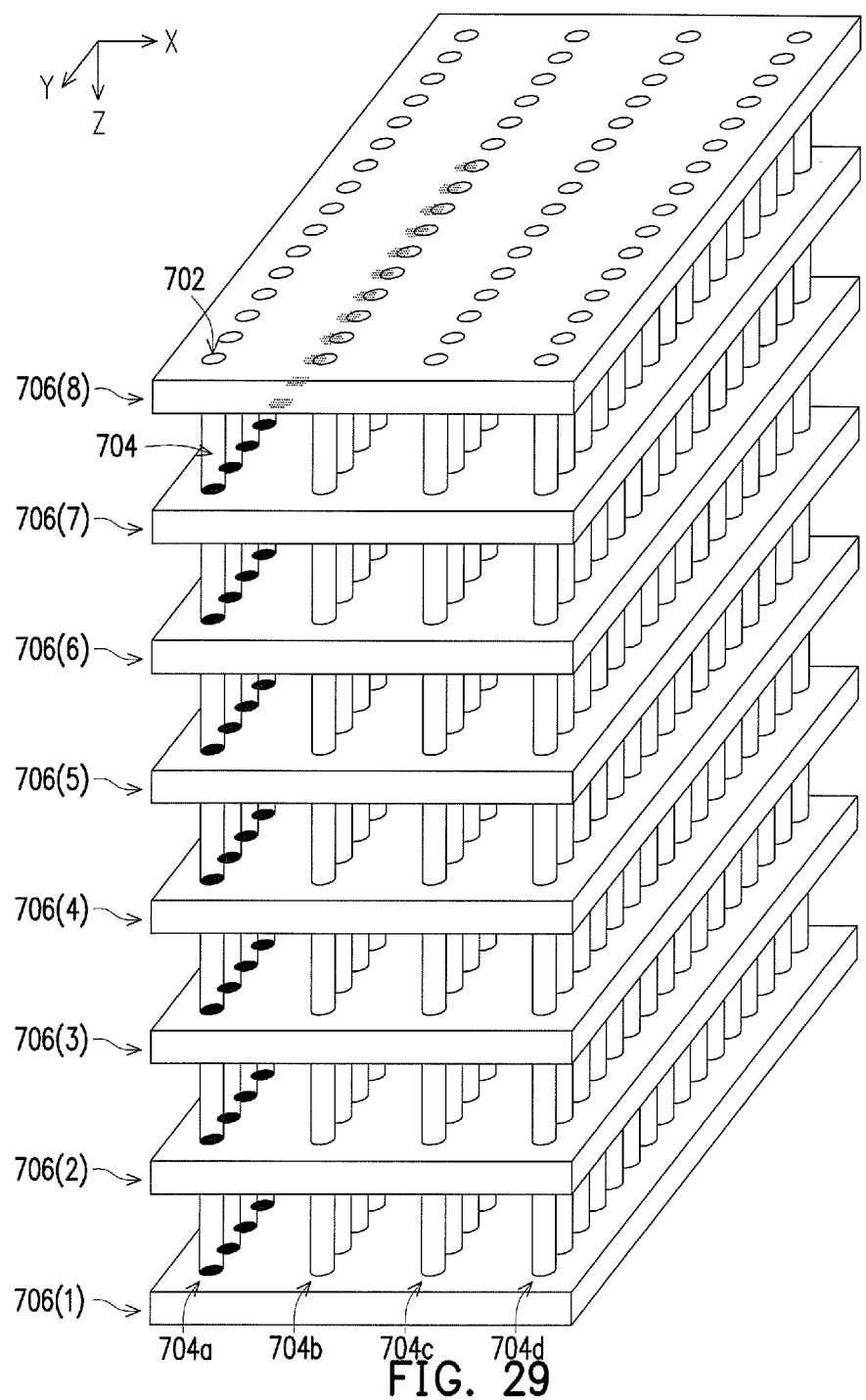
Figure 30:
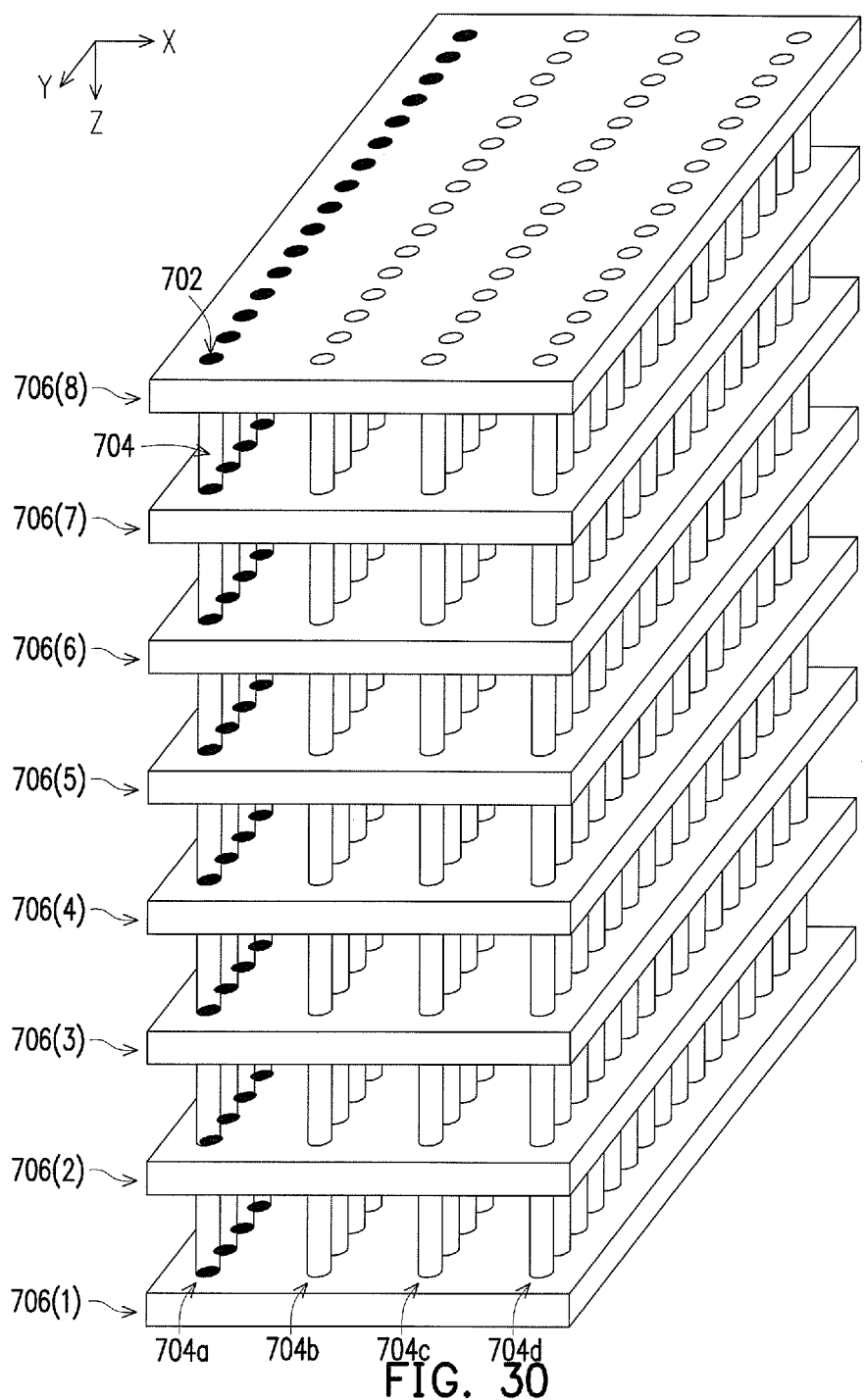
Figure 31:
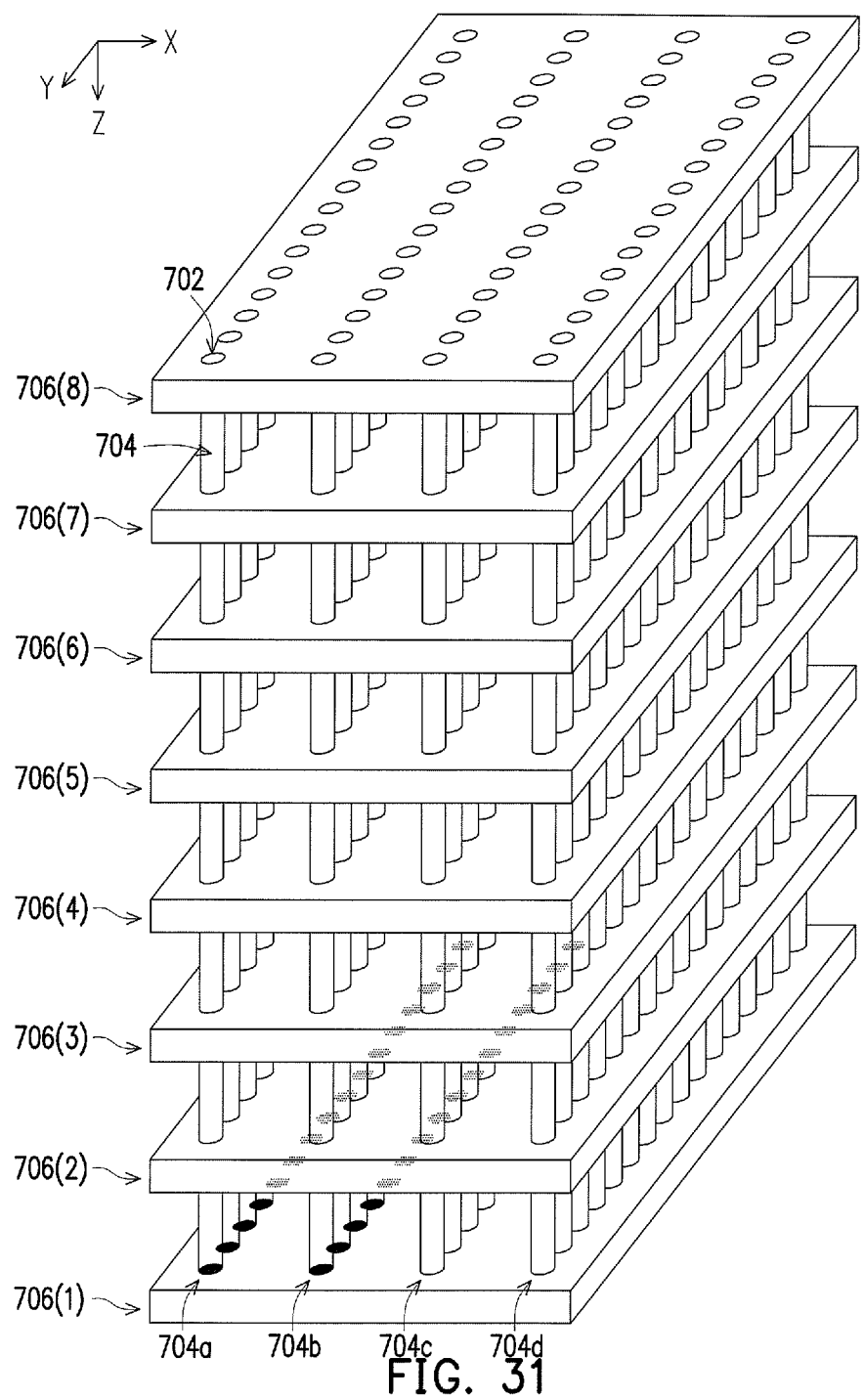
FIGS. 31 to 38 are schematic diagrams illustrating an example of programming data into the physical erasing unit by using the single-page mode according to the third exemplary embodiment of the invention.
Figure 32:
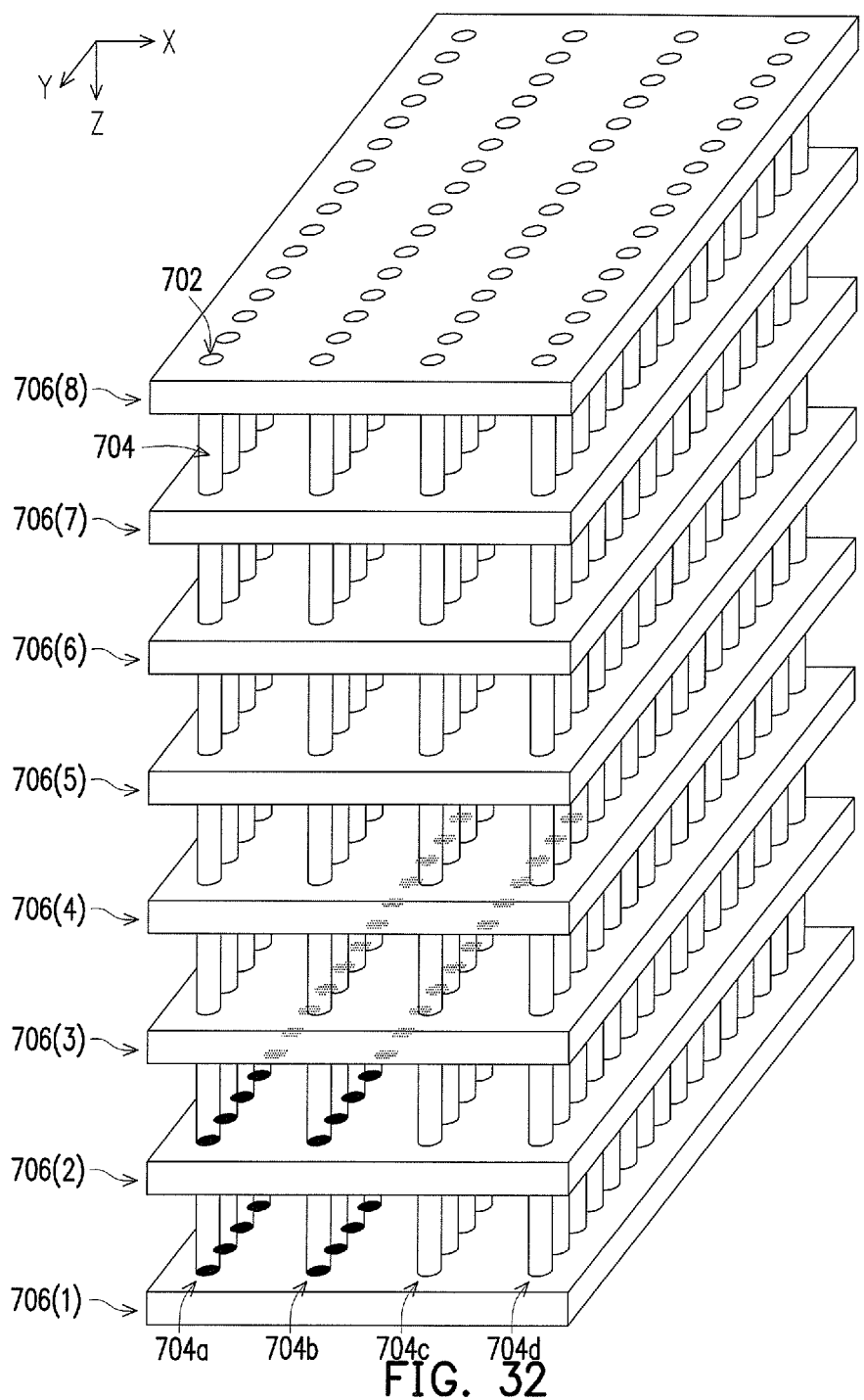
Figure 33:
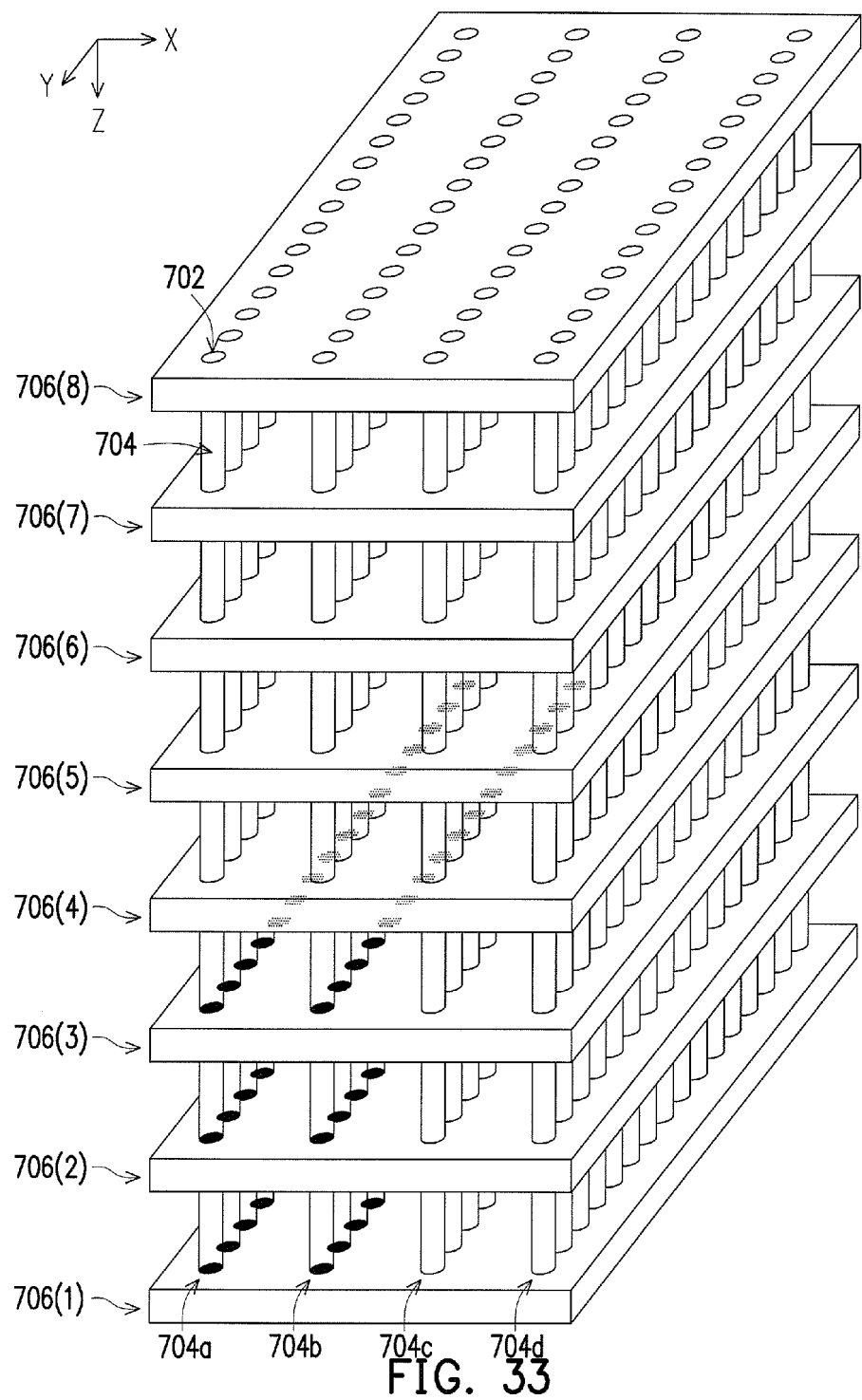
Figure 34:
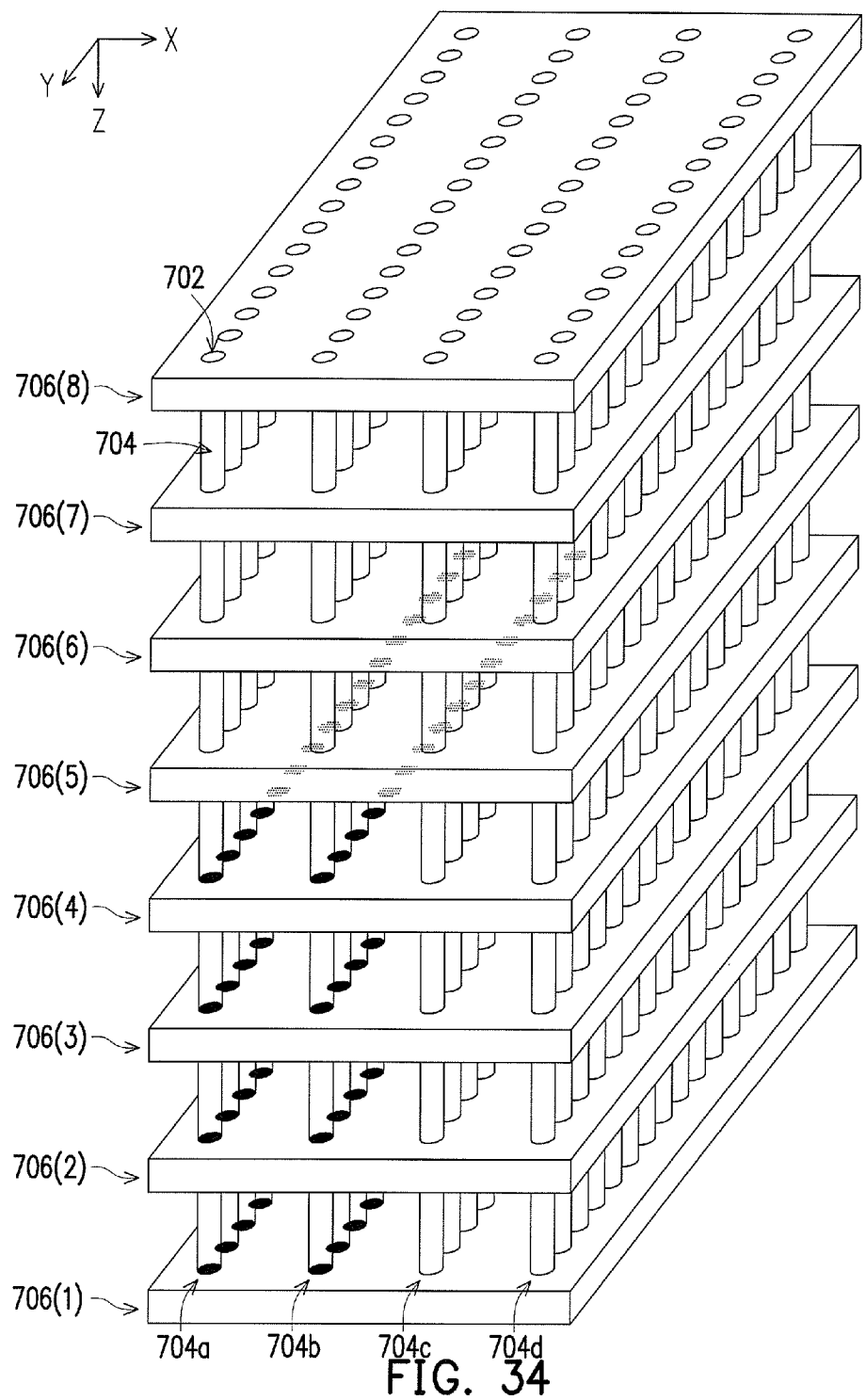
Figure 35:
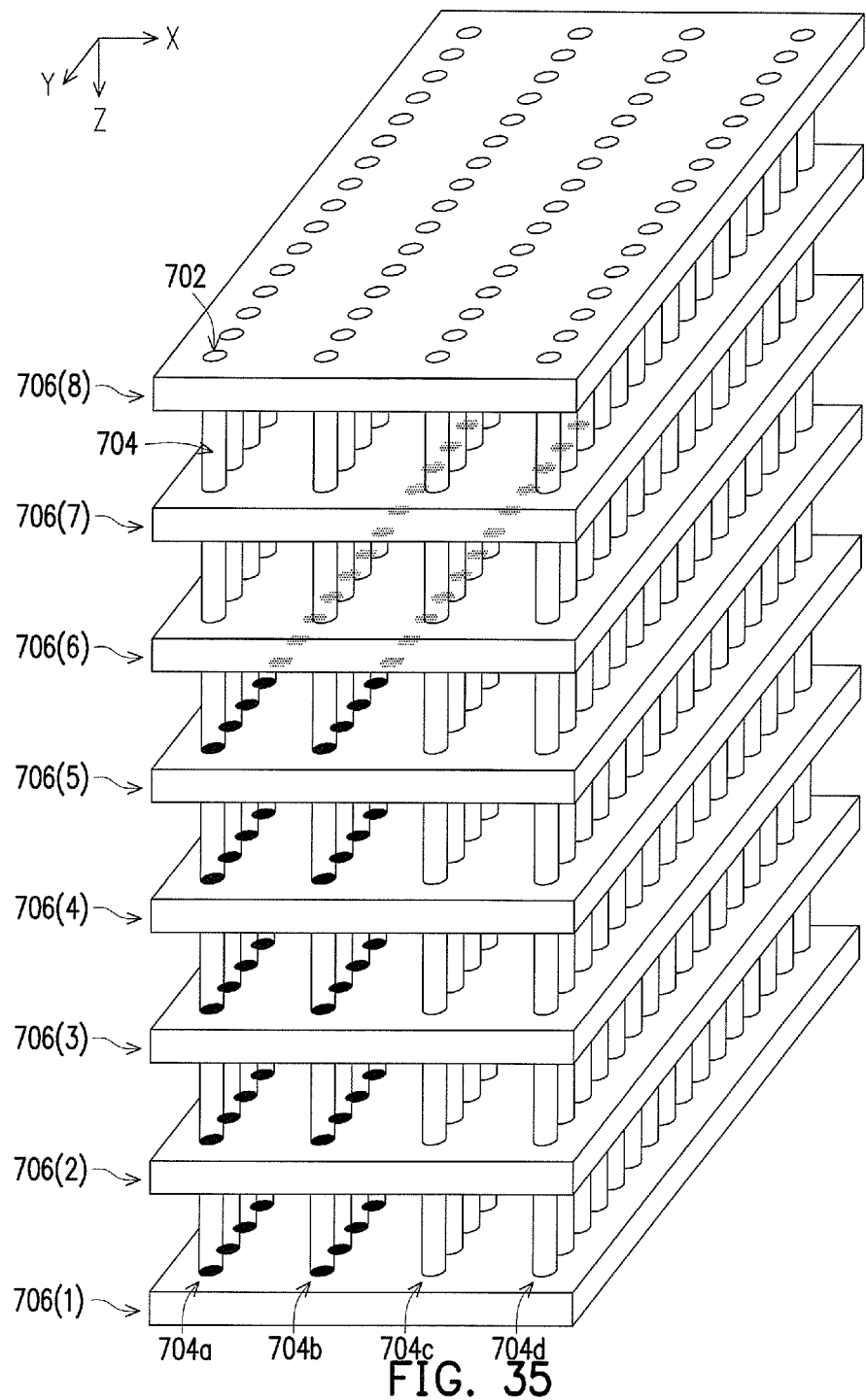
Figure 36:
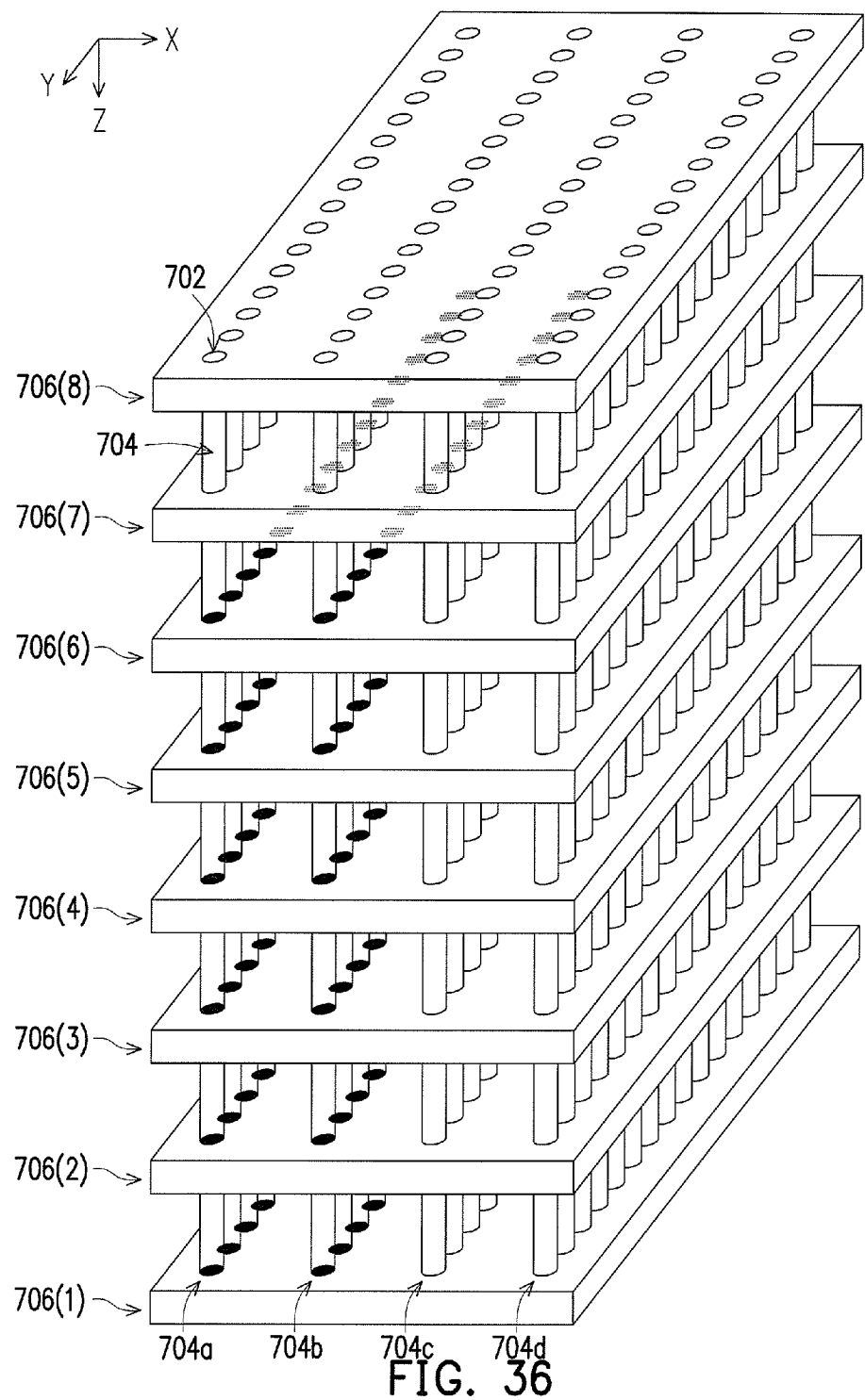
Figure 37:
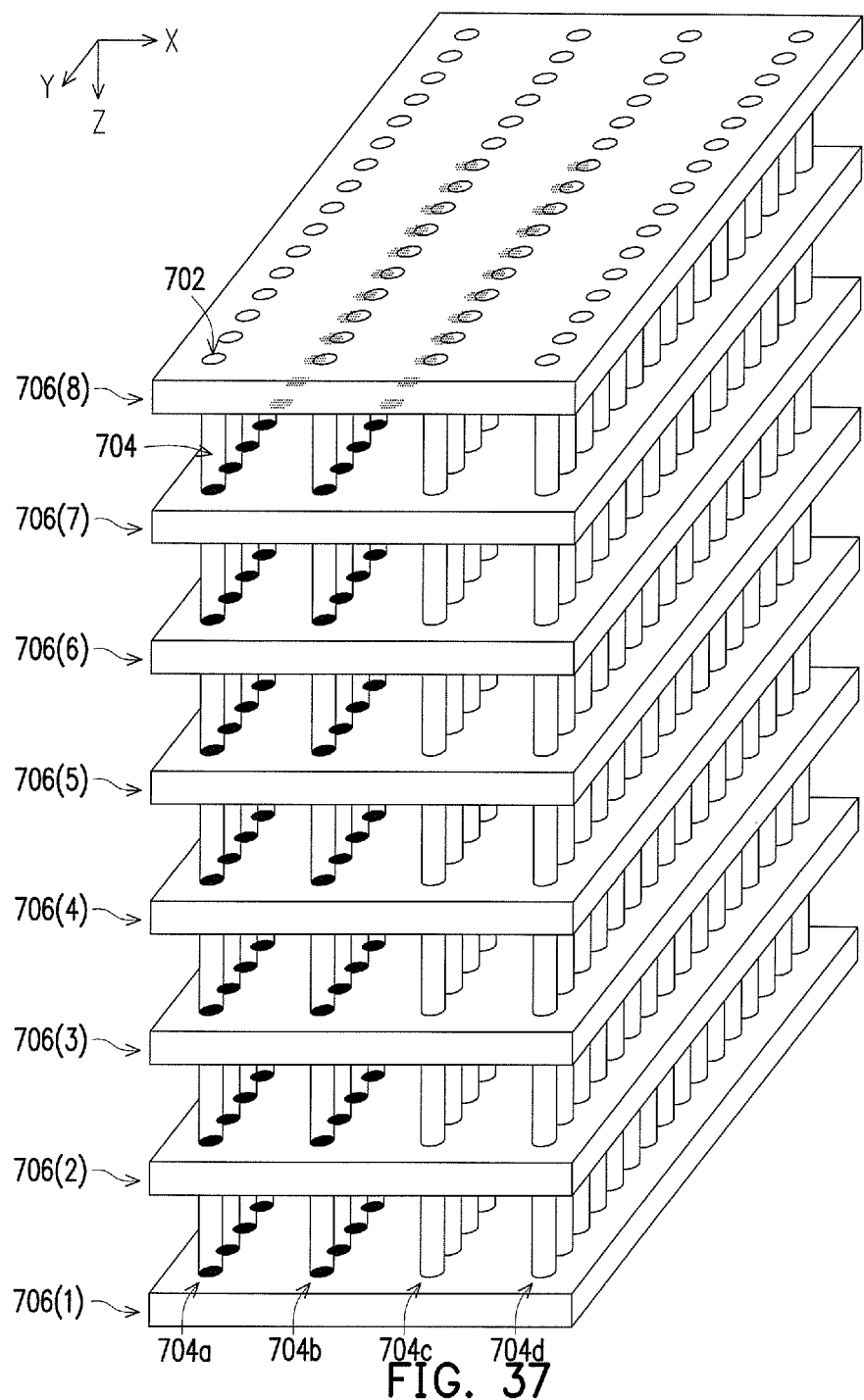
Figure 38:
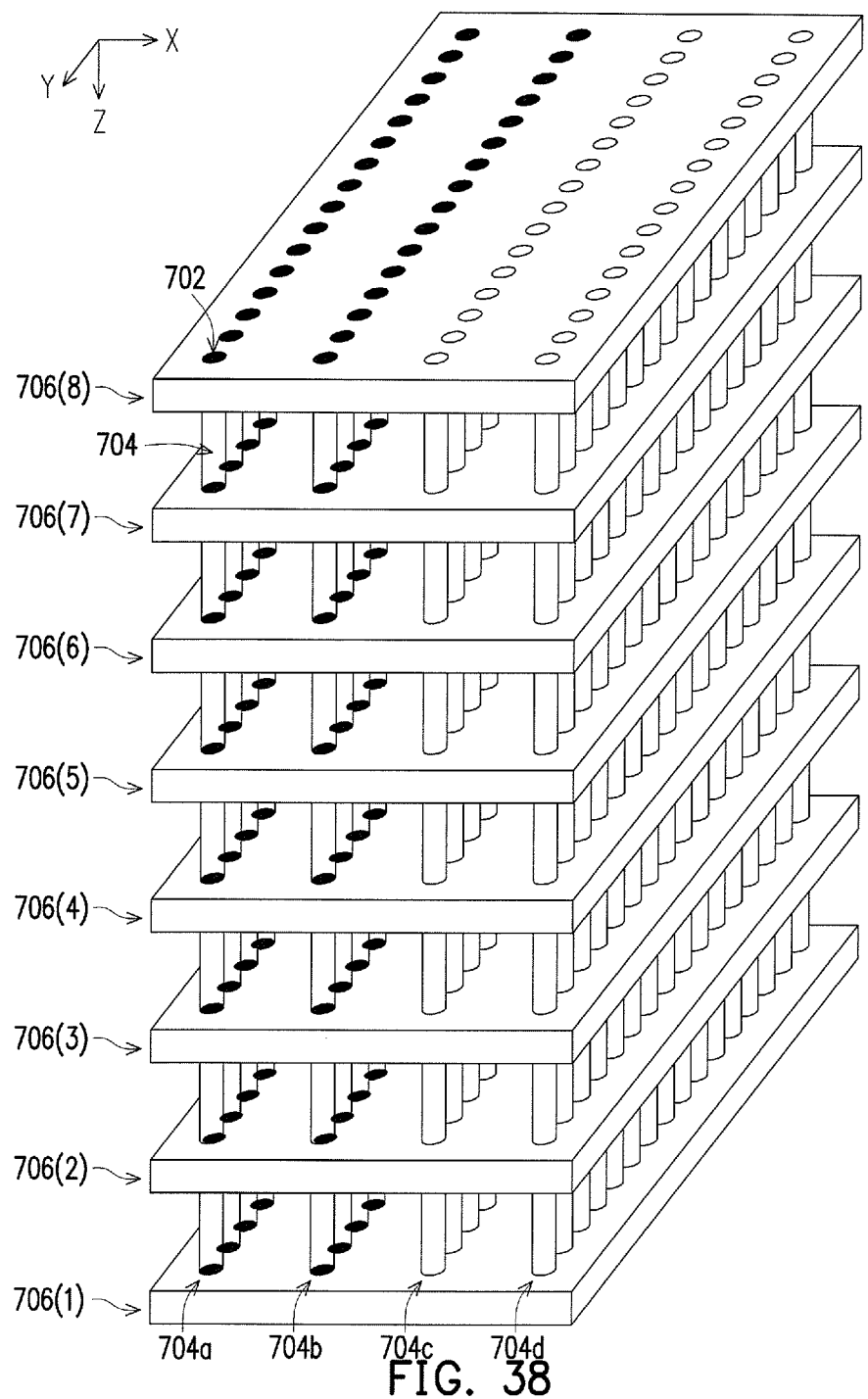
Figure 39:
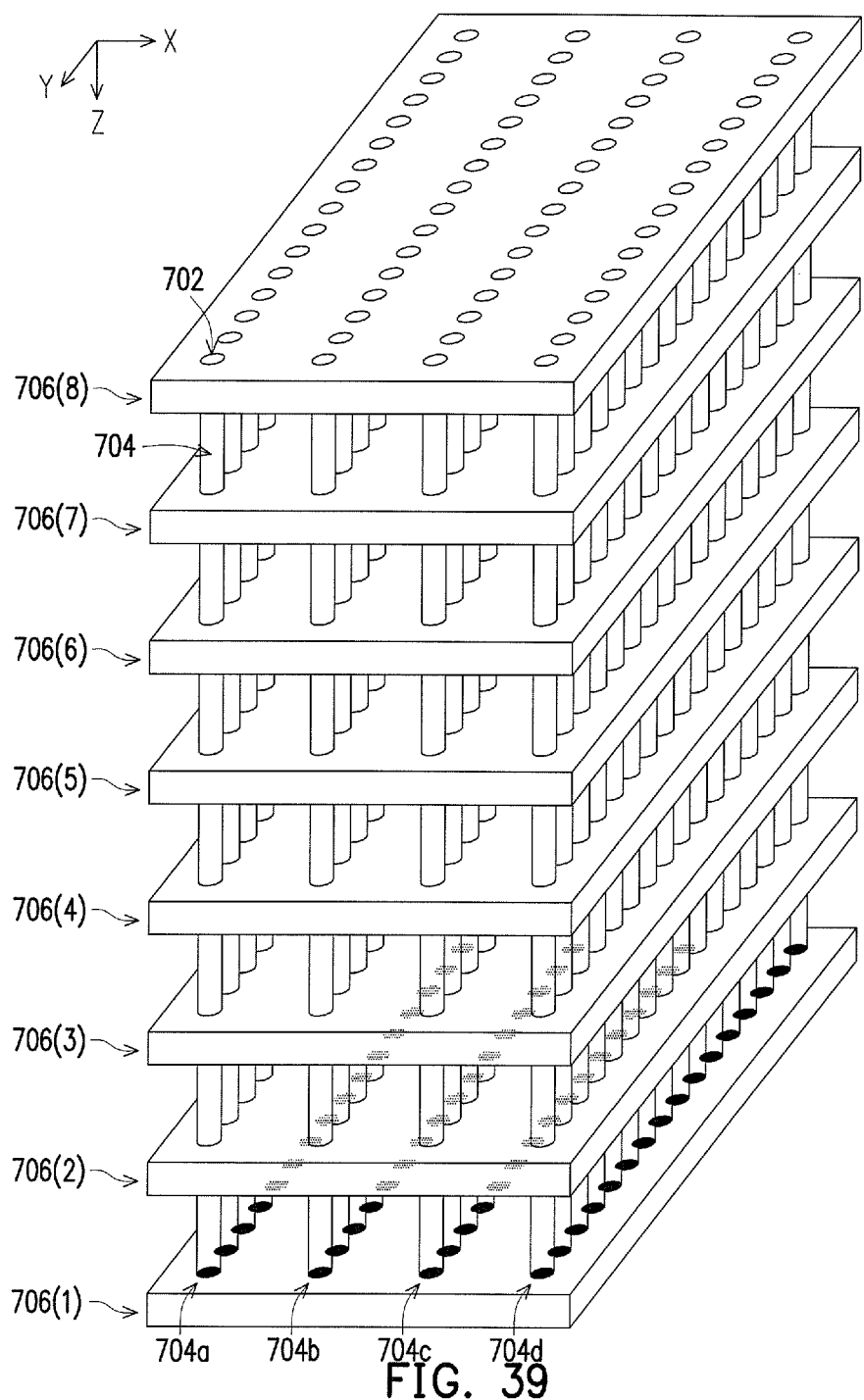
FIGS. 39 to 46 are schematic diagrams illustrating an example of programming data into the physical erasing unit by using the single-page mode according to the fourth exemplary embodiment of the invention.
Figure 40:
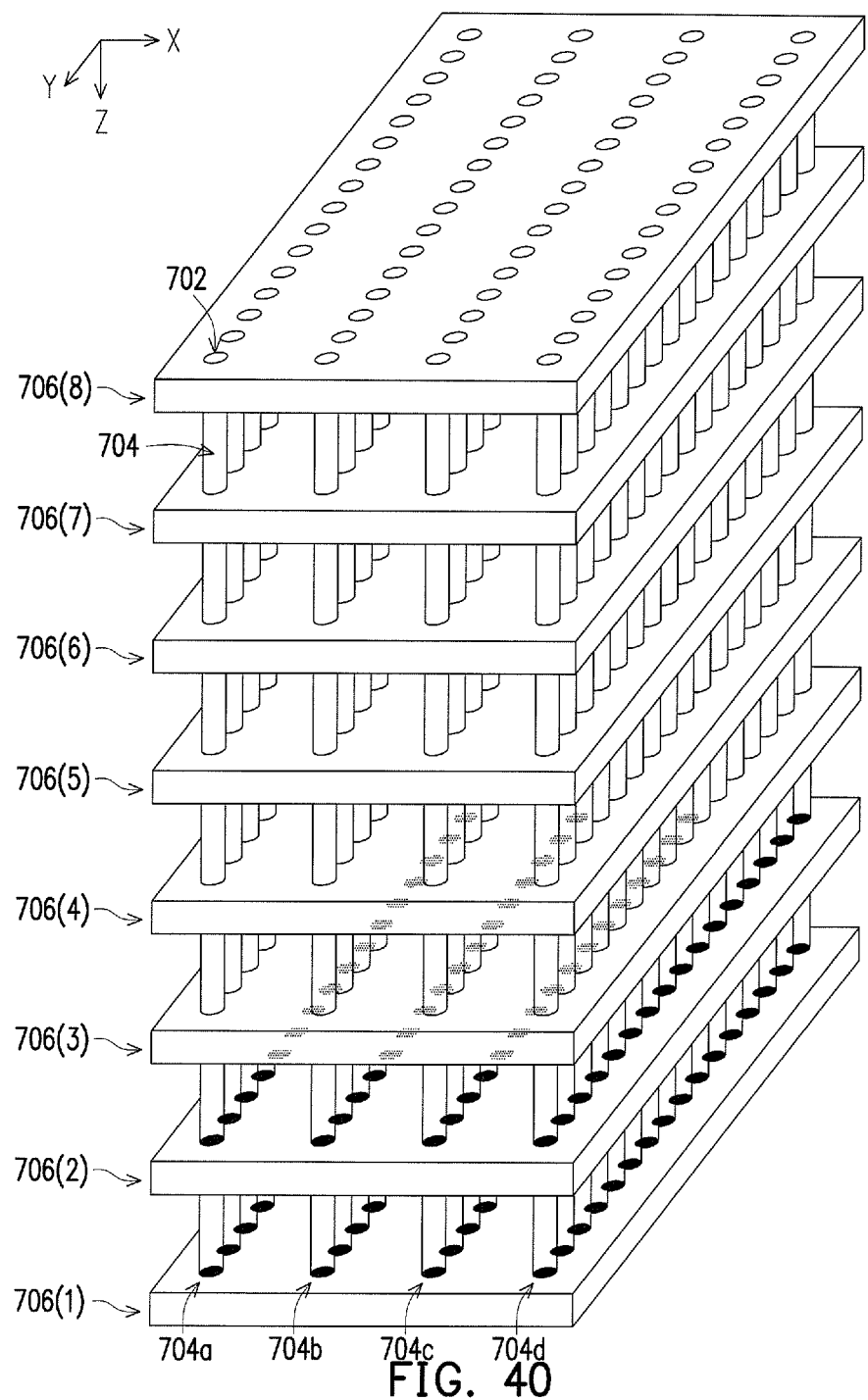
Figure 41:
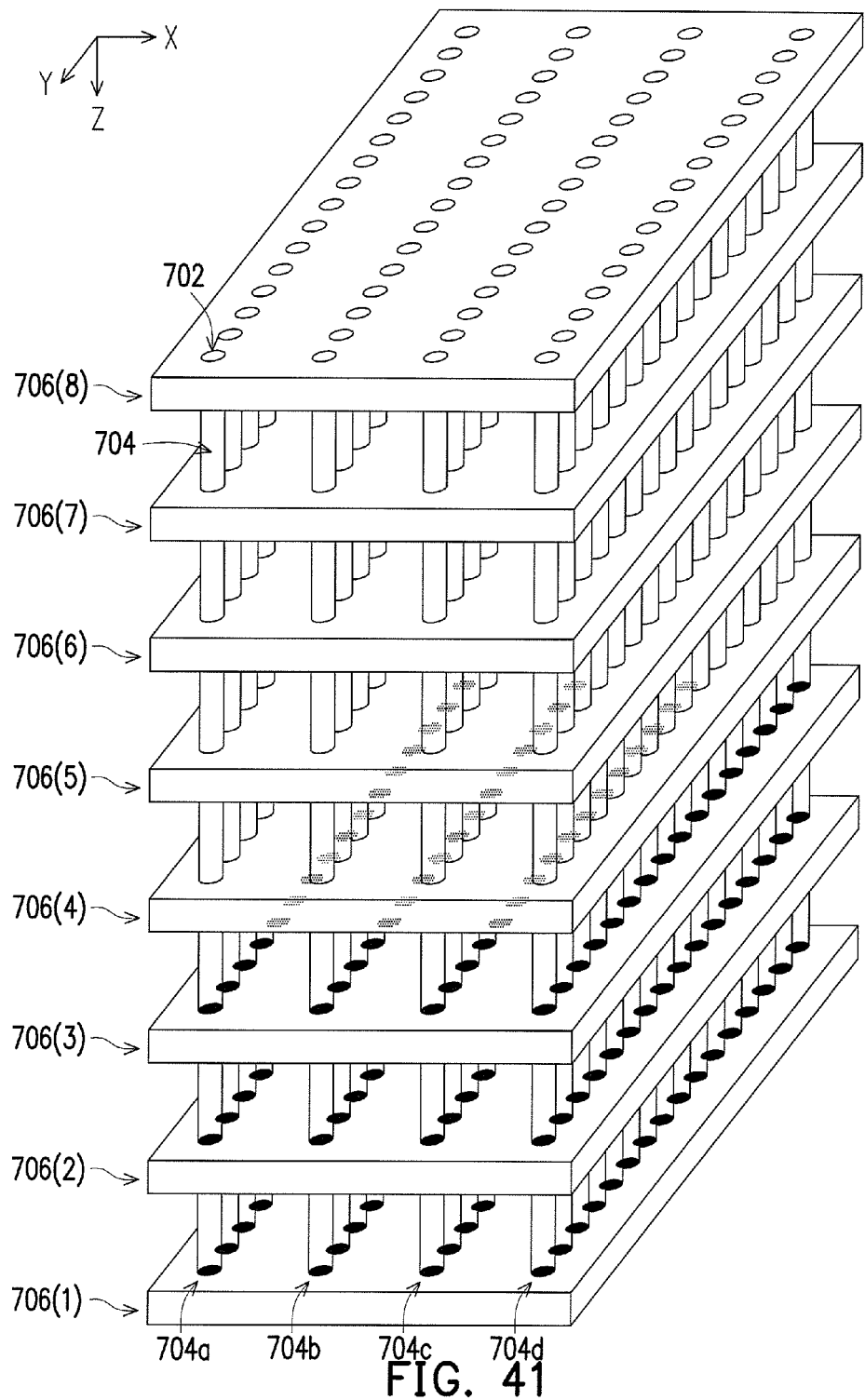
Figure 42:
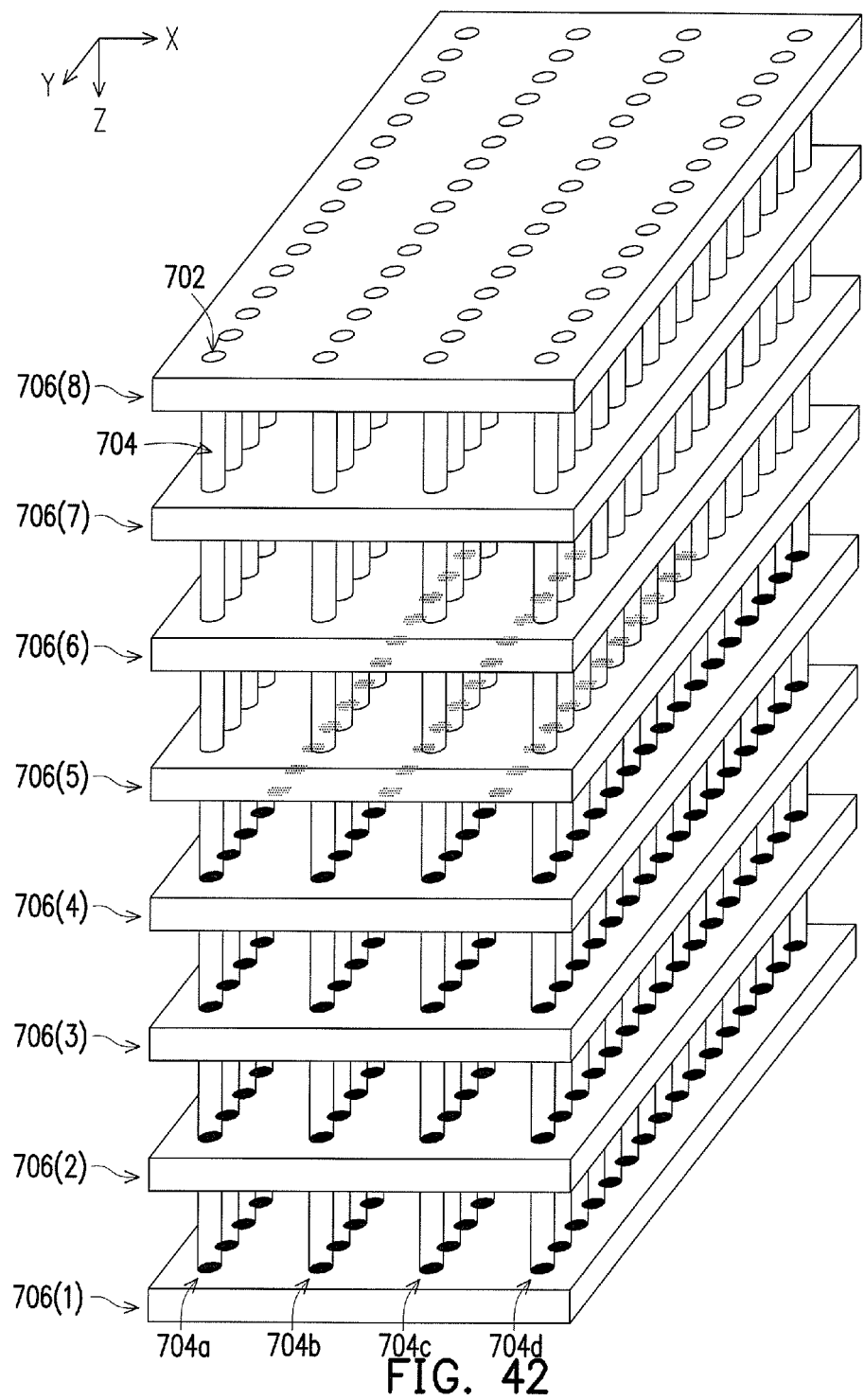
Figure 43:
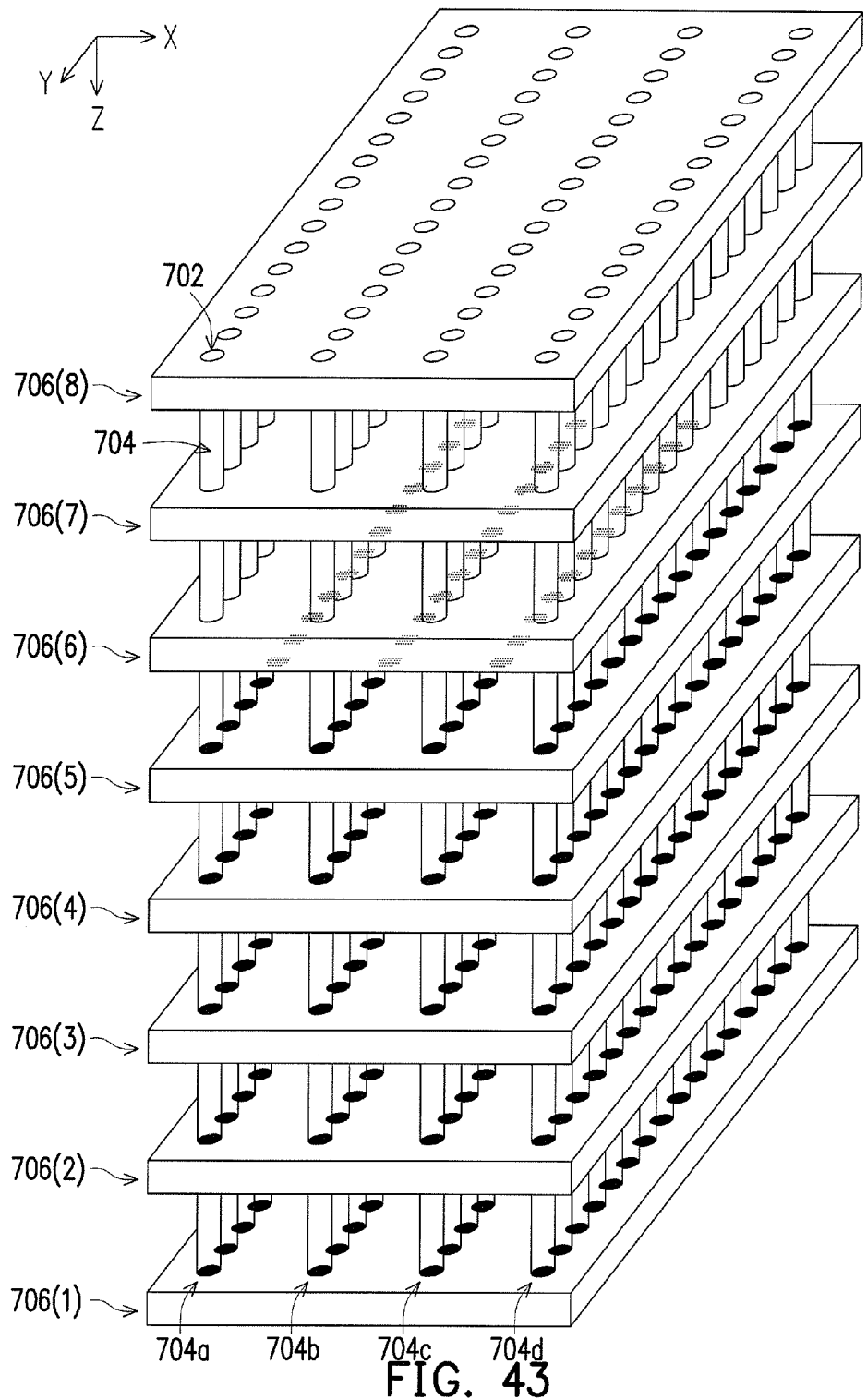
Figure 44:
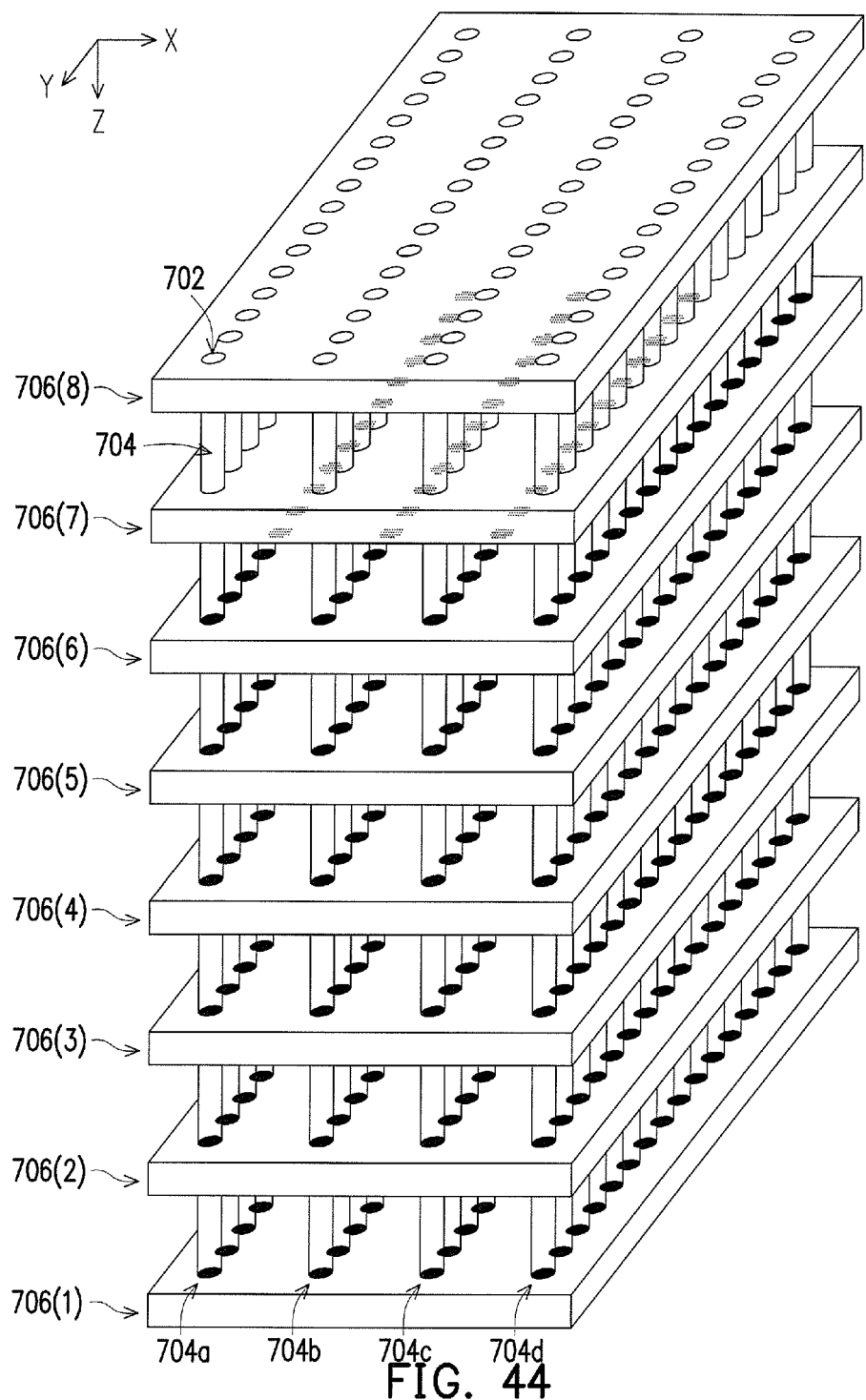
Figure 45:
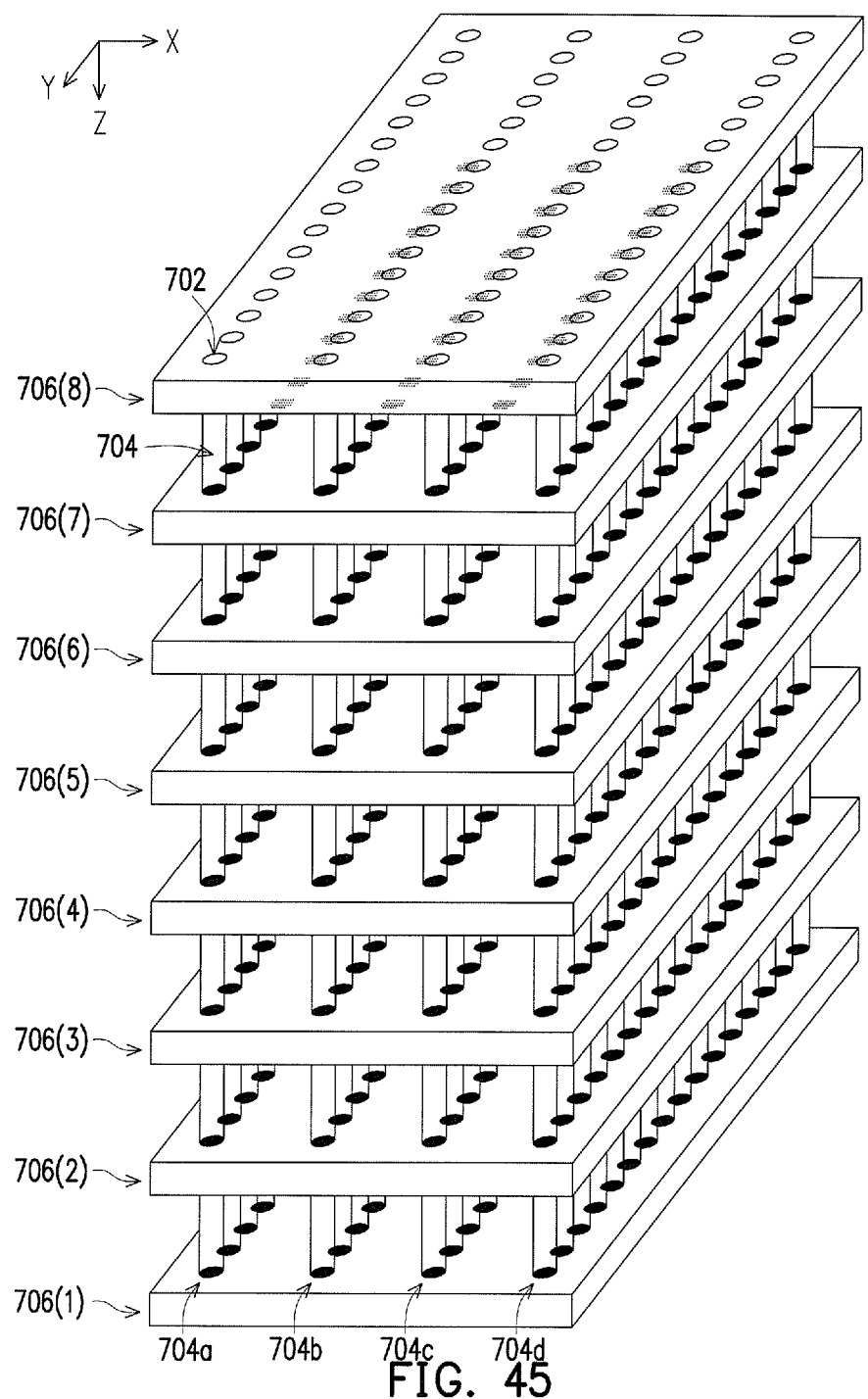
Figure 46:
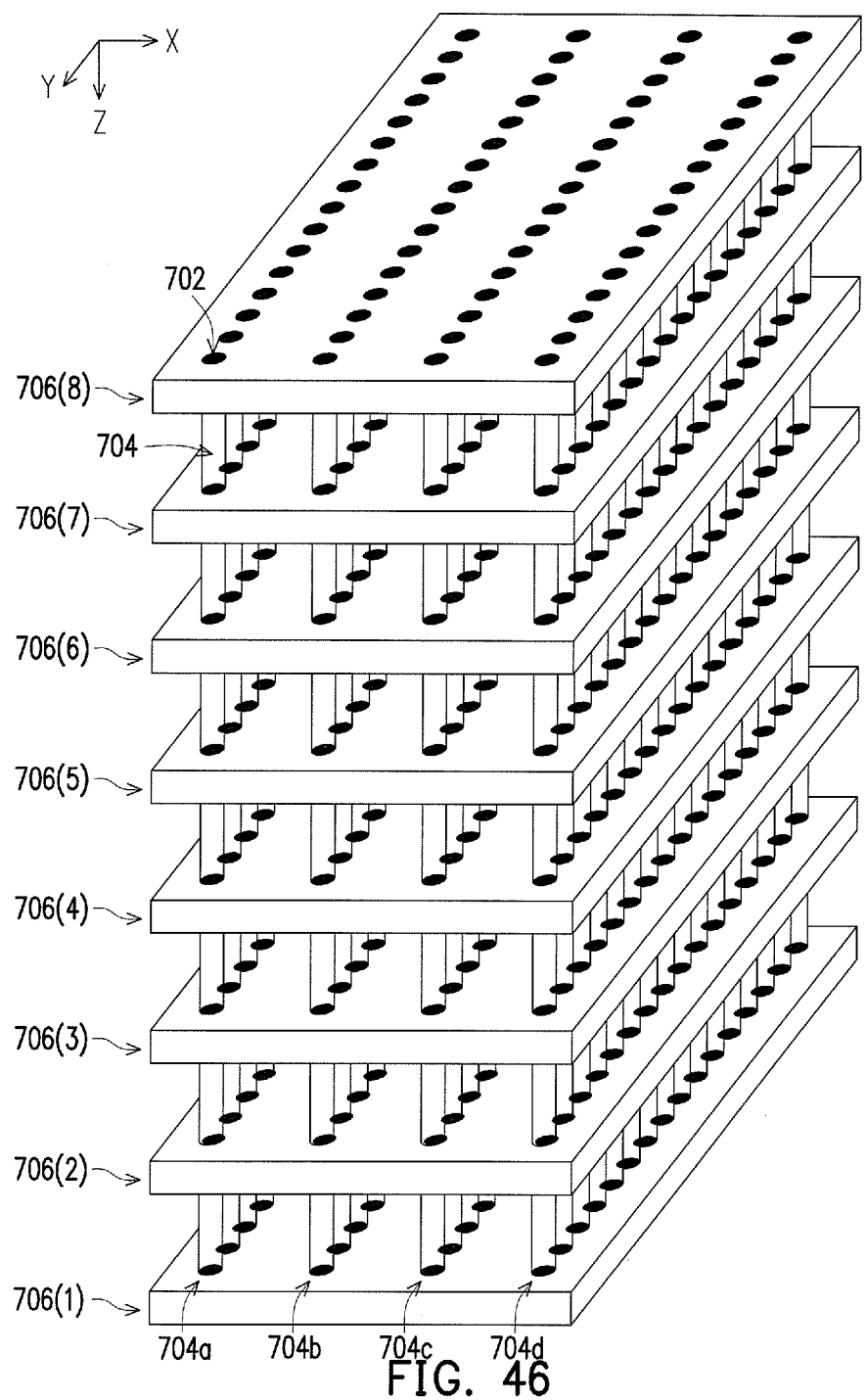

FIG. 14 is a flowchart illustrating a memory programming method according to an exemplary embodiment of the invention.

Referring to FIG. 14, in step S1601, the memory control circuit unit 104 (or the memory management circuit 202) programs a data stream (hereinafter, also known as a first data stream) into one physical programming unit (hereinafter, also known as a first physical programming unit) of a physical erasing unit, wherein the first physical programming unit is constituted by the memory cells at intersection of the first bit line set 704a and the first word line layer 706(1).

Thereafter, in step S1603, after programming the first data stream into the first physical programming unit, the memory control circuit unit 104 (or the memory management circuit 202) programs another data stream into another physical programming unit of the physical erasing unit, wherein the another physical programming unit is constituted by the memory cells at intersection of the first bit line set 704a and another word line layer. In particular, while programming the another data stream into the another physical programming unit of the physical erasing unit, the memory cells at intersection of other bit line sets (e.g., the second bit line set 704b, the third bit line set 704c and the fourth bit line set 704d) and the first word line layer 706(1) are not programmed.

FIGS. 15 to 22 are schematic diagrams illustrating an example of programming data into the physical erasing unit by using the single-page mode according to the first exemplary embodiment of the invention.

Referring to FIGS. 15 to 22, if the single-page mode is used to program data into one physical erasing unit, the memory control circuit unit 104 (or the memory management circuit 202) organizes the data into a plurality of data streams corresponding to the physical programming units of the physical erasing unit, so as to program the data streams into each physical erasing unit, wherein black dots represent the programmed memory cells. Specifically, the memory control circuit unit 104 (r the memory management circuit 202) first instructs the control circuit 2212 of the rewritable non-volatile memory module 106 to program a corresponding data stream (hereinafter also known as the first data stream) into the memory cells at intersection of the first bit line set 704a and the first word line layer 706(1), wherein one physical programming unit (hereinafter, also known as the first physical programming unit) is constituted by said memory cells. Then, the memory control circuit unit 104 (or the memory management circuit 202) instructs the control circuit 2212 of the rewritable non-volatile memory module 106 to sequentially program the corresponding data streams into the memory cells at intersection of the first bit line set 704a and the third word line layer 706(3), the memory cells at intersection of the first bit line set 704a and the fifth word line layer 706(5) and the memory cells at intersection of the first bit line set 704a and the seventh word line layer 706(7). Then, the memory control circuit unit 104 (or the memory management circuit 202) instructs the control circuit 2212 of the rewritable non-volatile memory module 106 to sequentially program the corresponding data streams into the memory cells at intersection of the first bit line set 704a and the second word line layer 706(2), the memory cells at intersection of the first bit line set 704a and the fourth word line layer 706(4), the memory cells at intersection of the first bit line set 704a and the sixth word line layer 706(6) and the memory cells at intersection of the first bit line set 704a and the eighth word line layer 706(8). Then, the memory control circuit unit 104 (or the memory management circuit 202) continues to sequentially program the corresponding data streams into the memory cells at intersection of the second bit line set 704b and the first word line layer 706(1), the memory cells at intersection of the second bit line set 704b and the third word line layer 706(3), the memory cells at intersection of the second bit line set 704b and the fifth word line layer 706(5), the memory cells at intersection of the second bit line set 704b and the seventh word line layer 706(7), the memory cells at intersection of the second bit line set 704b and the second word line layer 706(2), the memory cells at intersection of the second bit line set 704b and the fourth word line layer 706(4), the memory cells at intersection of the second bit line set 704b and the sixth word line layer 706(6) and the memory cells at intersection of the second bit line set 704b and the eighth word line layer 706(8). By analogy, the memory control circuit unit 104 (or the memory management circuit 202) continues to program the memory cells on the third bit line set 704c and the fourth bit line set 704d. In other words, during the programming process, the memory control circuit unit 104 (or the memory management circuit 202) skips the memory cells at intersection of one word line layer and a part of the bit line sets, and programs the memory cells on another non-adjacent word line layer instead.

Second Exemplary Embodiment

A difference between the second exemplary embodiment and the first exemplary embodiment is that, the size of the write data buffer area is equal the size of one physical programming unit in the first exemplary embodiment, but the size of the write data buffer area is equal to the size of two physical programming units in the second exemplary embodiment. In particular, because the write data buffer area is capable of temporally storing the write data corresponding to two physical programming units, if the programming error occurs on the memory cells on one word line layer and one bit line set such that the data loss also occurs on the memory cells on the adjacent word line layer and the bit line set, the lost data of said memory cell may still be recovered according to the data in the write data buffer area. Accordingly, in the second exemplary embodiment, during the process of writing data into one physical erasing unit, after the memory cells on one word line layer and one bit line set are programmed by the memory control circuit unit 104 (or the memory management circuit 202), the memory control circuit unit 104 (or the memory management circuit 202) continues to program the memory cells on the next word line layer and said bit line set. In other words, the memory control circuit unit 104 (or the memory management circuit 202) programs the memory cells at intersection of each word line layer and the same bit line set first, and then programs the memory cells at intersection of each word line layer and another bit line set.

FIGS. 23 to 30 are schematic diagrams illustrating an example of programming data into the physical erasing unit by using the single-page mode according to the second exemplary embodiment of the invention.

Referring to FIGS. 23 to 30, if the single-page mode is used to program data into one physical erasing unit, the memory control circuit unit 104 (or the memory management circuit 202) organizes the data into a plurality of data streams corresponding to the physical programming units of the physical erasing unit, so as to program the data streams into each physical erasing unit. Specifically, the memory control circuit unit 104 (r the memory management circuit 202) first instructs the control circuit 2212 of the rewritable non-volatile memory module 106 to program a corresponding data stream (hereinafter also known as the first data stream) into the memory cells at intersection of the first bit line set 704a and the first word line layer 706(1), wherein one physical programming unit (hereinafter, also known as the first physical programming unit) is constituted by said memory cells. Then, the memory control circuit unit 104 (r the memory management circuit 202) instructs the control circuit 2212 of the rewritable non-volatile memory module 106 to program a corresponding data stream (hereinafter also known as a second data stream) into the memory cells at intersection of the first bit line set 704a and the second word line layer 706(2), wherein one physical programming unit (hereinafter, also known as a second physical programming unit) is constituted by said memory cells. Subsequently, the memory control circuit unit 104 (or the memory management circuit 202) sequentially programs the corresponding data streams into the memory cells at intersection of the first bit line set 704a and the third word line layer 706(3), the memory cells at intersection of the first bit line set 704a and the fourth word line layer 706(4), the memory cells at intersection of the first bit line set 704a and the fifth word line layer 706(5), the memory cells at intersection of the first bit line set 704a and the sixth word line layer 706(6), the memory cells at intersection of the first bit line set 704a and the seventh word line layer 706(7) and the memory cells at intersection of the first bit line set 704a and the eighth word line layer 706(8). Then, with the same sequence, the memory control circuit unit 104 (or the memory management circuit 202) continues to sequentially program the corresponding data streams into the memory cells on the second bit line set 704b, the memory cells on the third bit line set 704c the memory cells on the fourth bit line set 704d. In other words, during the programming process, the memory control circuit unit 104 (or the memory management circuit 202) skips the memory cells at intersection of on one word line layer and a part of the bit line sets, and programs the memory cells on another word line layer instead.

Third Exemplary Embodiment

A difference between the third exemplary embodiment and the second exemplary embodiment is that, the size of the write data buffer area is equal the size of two physical programming units in the second exemplary embodiment, but the size of the write data buffer area is equal to the size of four physical programming units in the third exemplary embodiment. Accordingly, in the third exemplary embodiment, during the process of writing data into one physical erasing unit, the memory control circuit unit 104 (or the memory management circuit 202) sequentially or simultaneously programs the memory cells at intersection of one word line layer and two bit line sets, and after programming the memory cells on this one word line layer and the two bit line set, the memory control circuit unit 104 (or the memory management circuit 202) then continues to program the memory cells on the next word line layer and the two bit line sets.

FIGS. 31 to 38 are schematic diagrams illustrating an example of programming data into the physical erasing unit by using the single-page mode according to the third exemplary embodiment of the invention.

Referring to FIGS. 31 to 38, if the single-page mode is used to program data into one physical erasing unit, the memory control circuit unit 104 (or the memory management circuit 202) organizes the data into a plurality of data streams corresponding to the physical programming units of the physical erasing unit, so as to program the data streams into each physical erasing unit. Specifically, the memory control circuit unit 104 (r the memory management circuit 202) first instructs the control circuit 2212 of the rewritable non-volatile memory module 106 to program the corresponding data stream into the memory cells at intersection of the first bit line set 704a and the first word line layer 706(1), and program the corresponding data stream into the memory cells at intersection of the second bit line set 704b and the first word line layer 706(1). Herein, the memory control circuit unit 104 (or the memory management circuit 202) simultaneously issues commands for programming the memory cells at intersection of the first word line layer 704a and the first word line layer 706(1) and the memory cells at intersection of the second bit line set 704b and the first word line layer 706(1). However, the invention is not limited thereto. In another exemplary embodiment, the memory control circuit unit 104 (or the memory management circuit 202) may also issue the command for programming the memory cells at intersection of the first bit line set 704a and the first word line layer 706(1) first.

And then, after the memory cells at intersection of the first bit line set 704a and the first word line layer 706(1) are programmed, the command for programming the memory cells at intersection of the second bit line set 704b and the first word line layer 706(1) is then issued. Subsequently, the memory control circuit unit 104 (or the memory management circuit 202) instructs the control circuit 2212 of the rewritable non-volatile memory module 106 to program the corresponding data streams into the memory cells at intersection of the first bit line set 704a and the second word line layer 706(2) and the memory cells at intersection of the second bit line set 704b and the second word line layer 706(2). Then, the memory control circuit unit 104 (or the memory management circuit 202) instructs the control circuit 2212 of the rewritable non-volatile memory module 106 to program the corresponding data streams into the memory cells at intersection of the first bit line set 704a and the third word line layer 706(3) and the memory cells at intersection of the second bit line set 704b and the third word line layer 706(3). By analogy, the memory control circuit unit 104 (or the memory management circuit 202) instructs the control circuit 2212 of the rewritable non-volatile memory module 106 to sequentially program the corresponding data streams into the memory cells at intersection of the first bit line set 704a and the fourth word line layer 706(4) and the memory cells at intersection of the second bit line set 704b and the fourth word line layer 706(4); the memory cells at intersection of the first bit line set 704a and the fifth word line layer 706(5) and the memory cells at intersection of the second bit line set 704b and the fifth word line layer 706(5); the memory cells at intersection of the first bit line set 704a and the sixth word line layer 706(6) and the memory cells at intersection of the second bit line set 704b and the sixth word line layer 706(6); the memory cells at intersection of the first bit line set 704a and the seventh word line layer 706(7) and the memory cells at intersection of the second bit line set 704b and the seventh word line layer 706(7); and the memory cells at intersection of the first bit line set 704a and the eighth word line layer 706(8) and the memory cells at intersection of the second bit line set 704b and the eighth word line layer 706(8). Thereafter, with the same sequence, the memory control circuit unit 104 (or the memory management circuit 202) continues to sequentially program the corresponding data streams into the memory cells on the third bit line set 704c and the memory cells on the fourth bit line set 704d.

Fourth Exemplary Embodiment

A difference between the fourth exemplary embodiment and the third exemplary embodiment is that, the size of the write data buffer area is equal the size of four physical programming units in the third exemplary embodiment, but the size of the write data buffer area is equal to the size of eight physical programming units in the fourth exemplary embodiment. Accordingly, in the fourth exemplary embodiment, during the process of writing data into one physical erasing unit, the memory control circuit unit 104 (or the memory management circuit 202) sequentially or simultaneously programs the memory cells at intersection of one word line layer and four bit line sets, and after programming the memory cells on this one word line layer and the four bit line set, the memory control circuit unit 104 (or the memory management circuit 202) then continues to program the memory cells on the next word line layer and the four bit line sets.

FIGS. 39 to 46 are schematic diagrams illustrating an example of programming data into the physical erasing unit by using the single-page mode according to the fourth exemplary embodiment of the invention.

Referring to FIGS. 39 to 46, if the single-page mode is used to program data into one physical erasing unit, the memory control circuit unit 104 (or the memory management circuit 202) organizes the data into a plurality of data streams corresponding to the physical programming units of the physical erasing unit, so as to program the data streams into each physical erasing unit. Specifically the memory control circuit unit 104 (or the memory management circuit 202) first instructs the control circuit 2212 of the rewritable non-volatile memory module 106 to program the corresponding data streams into the memory cells at intersection of the first bit line set 704a and the first word line layer 706(1), program the corresponding data stream into the memory cells at intersection of the second bit line set 704b and the first word line layer 706(1), program the corresponding data stream into the memory cells at intersection of the third bit line set 704c and the first word line layer 706(1), and program the corresponding data stream into the memory cells at intersection of the fourth bit line set 704d and the first word line layer 706(1). Herein, the memory control circuit unit 104 (or the memory management circuit 202) simultaneously issues the commands for programming the memory cells at intersection of the first bit line set 704a and the first word line layer 706(1), the memory cells at intersection of the second bit line set 704b and the first word line layer 706(1), the memory cells at intersection of the third bit line set 704c and the first word line layer 706(1) and the memory cells at intersection of the fourth bit line set 704d and the eighth word line layer 706(1). However, the invention is not limited thereto. In another exemplary embodiment, the memory control circuit unit 104 (or the memory management circuit 202) may also issue the command for programming the memory cells at intersection of the first bit line set 704a and the first word line layer 706(1) first. And then, after the memory cells at intersection of the first bit line set 704a and the first word line layer 706(1) are programmed, the command for programming the memory cells at intersection of the second bit line set 704b and the first word line layer 706(1) is then issued. Subsequently, after the memory cells at intersection of the second bit line set 704b and the first word line layer 706(1) are programmed, the command for programming the memory cells at intersection of the third bit line set 704c and the first word line layer 706(1) is then issued. Lastly, after the memory cells at intersection of the third bit line set 704c and the first word line layer 706(1) are programmed, the command for programming the memory cells at intersection of the fourth bit line set 704d and the first word line layer 706(1) is then issued. After the memory cells at intersection of the first bit line set 704a and the first word line layer 706(1), the memory cells at intersection of the second bit line set 704b and the first word line layer 706(1), the memory cells at intersection of the third bit line set 704c and the first word line layer 706(1) and the memory cells at intersection of the fourth bit line set 704d and the first word line layer 706(1) are programmed, the memory control circuit unit 104 (or the memory management circuit 202) instructs the control circuit 2212 of the rewritable non-volatile memory module 106 to program the corresponding data streams into the memory cells at intersection of the first bit line set 704a and the second word line layer 706(2), the memory cells at intersection of the second bit line set 704b and the second word line layer 706(2), the memory cells at intersection of the third bit line set 704c and the second word line layer 706(2) and the memory cells at intersection of the fourth bit line set 704d and the second word line layer 706(2). Then, the memory control circuit unit 104 (or the memory management circuit 202) instructs the control circuit 2212 of the rewritable non-volatile memory module 106 to program the corresponding data streams into the memory cells at intersection of the first bit line set 704a and the third word line layer 706(3), the memory cells at intersection of the second bit line set 704b and the third word line layer 706(3), the memory cells at intersection of the third bit line set 704c and the third word line layer 706(3) and the memory cells at intersection of the fourth bit line set 704d and the third word line layer 706(3). By analogy, the memory control circuit unit 104 (or the memory management circuit 202) instructs the control circuit 2212 of the rewritable non-volatile memory module 106 to sequentially program the corresponding data streams into the memory cells of the other word line layers.

In summary, according to the memory programming method, the memory control circuit unit and the memory storage apparatus provided in the exemplary embodiments of the invention, during the process of programming data, the memory cells at intersection of each word line layer and the same bit line set are sequentially or alternately programmed, so as to prevent the data loss if open and short occurs on the word lines (or the word line layers).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory programming method for a physical erasing unit of a rewritable non-volatile memory module, wherein the physical erasing unit comprises a plurality of word line layers and a plurality of bit line sets, the bit line sets are arranged along a first direction and separated from one another, each of the bit line sets comprises a plurality of bit lines, the bit lines of each bit line sets are extended along a second direction, arranged along a third direction and separated from one another, the word line layers are stacked along the second direction and the word line layers are separated from one another, a memory cell is provided at intersection of each of the word line layers and each of the bit lines of each of the bit line sets, at least one physical programming unit is constituted by the memory cells at intersection of one of the bit line sets and one of the word line layers, and the memory programming method comprises:

programming a first data stream into at least one first physical programming unit of the physical erasing unit, wherein the at least one first physical programming unit is constituted by the memory cells at intersection of at least one first bit line set among the bit line sets and a first word line layer among the word line layers; and after programming the first data stream into the at least one first physical programming unit, programming another data stream into at least one another physical programming unit of the physical erasing unit, wherein the at least one another physical programming unit is constituted by the memory cells at intersection of the at least one first bit line set among the bit line sets and another word line layer among the word line layers.

2. The memory programming method of claim 1, wherein the memory cells at intersection of at least one other bit line set among the bit line sets and the first word line layer are not programmed.

3. The memory programming method of claim 1, wherein a second word line layer is provided between the first word line layer and the another word line layer among the word line layers.

4. The memory programming method of claim 3, further comprising:

after programming the another data stream into the at least one another physical programming unit, programming a second data stream into at least one second physical programming unit of the physical erasing unit, wherein the at least one second physical programming unit is constituted by the memory cells at intersection of the at least one first bit line set among the bit line sets and the second word line layer among the word line layers.

5. The memory programming method of claim 1, further comprising:

after programming the another data stream into the at least one another physical programming unit, programming an $N^{th}$ data stream into at least one Nth physical programming unit of the physical erasing unit, wherein the at least one $N^{th}$ physical programming unit is constituted by the memory cells at intersection of at least one second bit line set among the bit line sets and the first word line layer among the word line layers.

6. The memory programming method of claim 1, wherein the another word line layer is adjacent to the first word line layer.

7. The memory programming method of claim 6, further comprising:

after programming the another data stream into the at least one another physical programming unit, programming an $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

8. The memory programming method of claim 1, further comprising:

while programming the first data stream into the at least one first physical programming unit, simultaneously programming an $N^{th}$ data stream into at least one Nth physical programming unit of the physical erasing unit, wherein the at least one Nth physical programming unit is constituted by the memory cells at intersection of at least one second bit line set among the bit line sets and the first word line layer among the word line layers.

9. The memory programming method of claim 8, further comprising:

while programming the another data stream into the at least one another physical programming unit, simultaneously programming an other data stream into at least one other physical programming unit of the physical erasing unit, wherein the at least one other physical programming unit is constituted by the memory cells at intersection of the at least one second bit line set among the bit line sets and the another word line layer among the word line layers.

10. A memory control circuit unit, configured to access a rewritable non-volatile memory module, and the memory control circuit unit comprising:

a host interface, configured to couple to a host system;

a memory interface, configured to couple to the rewritable non-volatile memory module, wherein the rewritable non-volatile memory module comprises a physical erasing unit, the physical erasing unit comprises a plurality of word line layers and a plurality of bit line sets, the bit line sets are arranged along a first direction and separated from one another, each of the bit line sets comprises a plurality of bit lines, the bit lines of each bit line sets are extended along a second direction, arranged along a third direction and separated from one another, the word line layers are stacked along the second direction and the word line layers are separated from one another, a memory cell is provided at intersection of each of the word line layers and each of the bit lines of each of the bit line sets, at least one physical programming unit is constituted by the memory cells at intersection of one of the bit line sets and one of the word line layers; and a memory management circuit, coupled to the host interface and the memory interface, wherein the memory management circuit is configured to issue a first command sequence, so as to program a first data stream into at least one first physical programming unit of the physical erasing unit, wherein the at least one first physical programming unit is constituted by the memory cells at intersection of at least one first bit line set among the bit line sets and a first word line layer among the word line layers, wherein after programming the first data stream into the at least one first physical programming unit, the memory management circuit is further configured to issue a second command sequence, so as to program another data stream into at least one another physical programming unit of the physical erasing unit, wherein the at least one another physical programming unit is constituted by the memory cells at intersection of the at least one first bit line set among the bit line sets and another word line layer among the word line layers.

11. The memory control circuit unit of claim 10, wherein the memory cells at intersection of at least one other bit line set among the bit line sets and the first word line layer are not programmed.

12. The memory control circuit unit of claim 10, wherein a second word line layer is provided between the first word line layer and the another word line layer among the word line layers.

13. The memory control circuit unit of claim 12, wherein after programming the another data stream into the at least one another physical programming unit, the memory management circuit is further configured to issue a third command sequence, so as to program a second data stream into at least one second physical programming unit of the physical erasing unit, wherein the at least one second physical programming unit is constituted by the memory cells at intersection of the at least one first bit line set among the bit line sets and the second word line layer among the word line layers.

14. The memory control circuit unit of claim 10, wherein after programming the another data stream into the at least one another physical programming unit, the memory management circuit is further configured to issue a fourth command sequence, so as to program an $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

15. The memory control circuit unit of claim 10, wherein the another word line layer is adjacent to the first word line layer.

16. The memory control circuit unit of claim 15, wherein after programming the another data stream into the at least one another physical programming unit, the memory management circuit is further configured to issue a fifth command sequence, so as to program an $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

17. The memory control circuit unit of claim 10, wherein while programming the first data stream into the at least one first physical programming unit, the memory management circuit is further configured to simultaneously program an $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

18. The memory control circuit unit of claim 17, wherein while programming the another data stream into the at least one another physical programming unit, the memory management circuit is further configured to simultaneously program an other data stream into at least one other physical programming unit of the physical erasing unit, wherein the at least one other physical programming unit is constituted by the memory cells at intersection of the at least one second bit line set among the bit line sets and the another word line layer among the word line layers.

19. A memory storage apparatus, comprising:
a connection interface unit, configured to couple to a host system;
a rewritable non-volatile memory module, wherein the rewritable non-volatile memory module comprises a physical erasing unit, the physical erasing unit comprises a plurality of word line layers and a plurality of bit line sets, the bit line sets are arranged along a first direction and separated from one another, each of the bit line sets comprises a plurality of bit lines, the bit lines of each bit line sets are extended along a second direction, arranged along a third direction and separated from one another, the word line layers are stacked along the second direction and the word line layers are separated from one another, a memory cell is provided at intersection of each of the word line layers and each of the bit lines of each of the bit line sets, at least one physical programming unit is constituted by the memory cells at intersection of one of the bit line sets and one of the word line layers; and
a memory control circuit unit, coupled to the connection interface unit and the rewritable non-volatile memory module,
wherein the memory control circuit unit is configured to issue a first command sequence, so as to program a first data stream into at least one first physical programming unit of the physical erasing unit, wherein the at least one first physical programming unit is constituted by the memory cells at intersection of at least one first bit line set among the bit line sets and a first word line layer among the word line layers,
wherein after programming the first data stream into the at least one first physical programming unit, the memory control circuit unit is further configured to issue a second command sequence, so as to program another data stream into at least one another physical programming unit of the physical erasing unit, wherein the at least one another physical programming unit is constituted by the memory cells at intersection of the at least one first bit line set among the bit line sets and another word line layer among the word line layers.

20. The memory storage apparatus of claim 19, wherein the memory cells at intersection of at least one other bit line set among the bit line sets and the first word line layer are not programmed.

21. The memory storage apparatus of claim 20, wherein a second word line layer is provided between the first word line layer and the another word line layer among the word line layers.

22. The memory storage apparatus of claim 21, wherein after programming the another data stream into the at least one another physical programming unit, the memory control circuit unit is further configured to issue a third command sequence, so as to program a second data stream into at least one second physical programming unit of the physical erasing unit, wherein the at least one second physical programming unit is constituted by the memory cells at intersection of the at least one first bit line set among the bit line sets and the second word line layer among the word line layers.

23. The memory storage apparatus of claim 19, wherein after programming the another data stream into the at least one another physical programming unit, the memory control circuit unit is further configured to issue a fourth command sequence, so as to program at least one $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

24. The memory storage apparatus of claim 19, wherein the another word line layer is adjacent to the first word line layer.

25. The memory storage apparatus of claim 24, wherein after programming the another data stream into the at least one another physical programming unit, the memory control circuit unit is further configured to issue a fifth command sequence, so as to program an $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

26. The memory storage apparatus of claim 19, wherein while programming the first data stream into the at least one first physical programming unit, the memory control circuit unit is further configured to simultaneously program an $N^{th}$ data stream into at least one $N^{th}$ physical programming unit of the physical erasing unit, wherein the at least one $N^{th}$ physical programming unit is constituted by the memory cells at intersection of at least one second bit line set among the bit line sets and the first word line layer among the word line layers.

27. The memory storage apparatus of claim 26, wherein while programming the another data stream into the at least one another physical programming unit, the memory control circuit unit is further configured to simultaneously program an other data stream into at least one other physical programming unit of the physical erasing unit, wherein the at least one other physical programming unit is constituted by the memory cells at intersection of the at least one second bit line set among the bit line sets and the another word line layer among the word line layers.

* * * * *